(12) United States Patent
Moon et al.

(10) Patent No.: US 11,997,913 B2
(45) Date of Patent: May 28, 2024

(54) DEPOSITION MASK, METHOD OF FABRICATING THE SAME, AND METHOD OF MANUFACTURING DISPLAY DEVICE USING THE SAME

(71) Applicant: Samsung Display Co., Ltd., Yongin-si (KR)

(72) Inventors: Min Ho Moon, Seongnam-si (KR); Jin Oh Kwag, Yongin-si (KR); Seung Yong Song, Suwon-si (KR); Duck Jung Lee, Hwaseong-si (KR); Seul Lee, Hwaseong-si (KR); Sung Soon Im, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/210,653

(22) Filed: Jun. 16, 2023

(65) Prior Publication Data
US 2024/0040921 A1 Feb. 1, 2024

Related U.S. Application Data

(62) Division of application No. 16/914,446, filed on Jun. 28, 2020, now Pat. No. 11,723,260.

(30) Foreign Application Priority Data

Sep. 16, 2019 (KR) .......................... 10-2019-0113341

(51) Int. Cl.
*H01L 51/56* (2006.01)
*C23C 14/04* (2006.01)
(Continued)

(52) U.S. Cl.
CPC ......... *H10K 71/166* (2023.02); *C23C 14/042* (2013.01); *H10K 71/00* (2023.02)

(58) Field of Classification Search
CPC . H01L 27/3283; H01L 51/0011; H01L 51/56; H01L 23/544; H01L 51/001; C23C 14/042; C23C 16/042
See application file for complete search history.

(56) References Cited

U.S. PATENT DOCUMENTS 10,533,246 B2   1/2020 Mizumura et al.
10,663,857 B2 * 5/2020 Lv ........................... C23C 14/12
(Continued)

FOREIGN PATENT DOCUMENTS

KR       2003-110124       4/2003
KR    10-2013-0129544     11/2013
(Continued)

OTHER PUBLICATIONS

Notice of Allowance dated Mar. 22, 2023, in U.S. Appl. No. 16/914,446.

*Primary Examiner* — Jaehwan Oh
(74) *Attorney, Agent, or Firm* — CANTOR COLBURN LLP

(57) ABSTRACT

A deposition mask for making a display device, the deposition mask includes: a frame including a first opening; a first member disposed above the first opening of the frame and including a first portion surrounding at least one second opening and a second portion disposed in the second opening and physically separated from the first portion; and a second member disposed on the first member and including a first connecting portion connected to the frame and a second mesh portion overlapping the second portion.

3 Claims, 24 Drawing Sheets

(51) Int. Cl.
 *H10K 71/00* (2023.01)
 *H10K 71/16* (2023.01)

(56) References Cited

U.S. PATENT DOCUMENTS

| | | | |
|---|---|---|---|
| 2016/0001542 A1* | 1/2016 | Saito | B32B 15/00 |
| | | | 156/247 |
| 2016/0301036 A1* | 10/2016 | Han | C23C 14/042 |
| 2017/0036230 A1* | 2/2017 | Mizumura | B05D 7/24 |
| 2017/0130321 A1* | 5/2017 | Mizumura | C23C 14/086 |
| 2017/0222145 A1* | 8/2017 | Kim | B05C 21/005 |
| 2018/0083192 A1* | 3/2018 | Jeong | H10K 71/20 |
| 2019/0203337 A1* | 7/2019 | Luo | C23C 16/52 |
| 2021/0013284 A1 | 1/2021 | Moon et al. | |

FOREIGN PATENT DOCUMENTS

| | | |
|---|---|---|
| KR | 10-2016-0116515 | 10/2016 |
| KR | 10-2016-0145607 | 12/2016 |
| KR | 10-2017-0028311 | 3/2017 |
| KR | 10-2018-0047594 | 5/2018 |

\* cited by examiner

DEPOSITION MASK, METHOD OF FABRICATING THE SAME, AND METHOD OF MANUFACTURING DISPLAY DEVICE USING THE SAME

CROSS REFERENCE TO RELATED APPLICATION

This application is a Divisional of U.S. patent application Ser. No. 16/914,446, filed Jun. 28, 2020, which claims priority from and the benefit of Korean Patent Application No. 10-2019-0113341, filed on Sep. 16, 2019, each of which is hereby incorporated by reference for all purposes as if fully set forth herein.

BACKGROUND

Field

Exemplary implementations of the invention relate generally to deposition of layers for making electronic devices and, more particularly to a deposition mask, a method of fabricating the same, and a method of manufacturing a display device using the same.

Discussion of the Background

Organic light-emitting display devices are a type of display device that has self-emitting display elements and include the advantages of a wide viewing angle, a high contrast, and a fast response time. Accordingly, the organic light-emitting display devices are attracting attention as next generation display devices.

Organic light-emitting display devices include an intermediate layer including at least a light-emitting layer between electrodes opposite to each other. The electrodes and the intermediate layer may be formed through various methods, and one method thereof is a deposition method.

The above information disclosed in this Background section is only for understanding of the background of the inventive concepts, and, therefore, it may contain information that does not constitute prior art.

SUMMARY

Deposition masks constructed according to the principles exemplary implementations of the invention and exemplary methods of manufacturing same and display devices using such a deposition mask have improved manufacturing process efficiency and/or avoid visual defects in the resulting deposition film. For example, deposition masks constructed according to exemplary implementations include a hole forming portion not directly supported by the frame of the deposition mask, thereby enabling the hole of the corresponding deposition film to be formed using only one open mask, and thus process efficiency can be improved. In addition, a dark line on the deposition film due to a connecting member required to support the hold forming portion is obviated, thereby eliminating visual defects.

Additional features of the inventive concepts will be set forth in the description which follows, and in part will be apparent from the description, or may be learned by practice of the inventive concepts.

According to one aspect of the invention, a deposition mask for making a display device includes: a frame including a first opening; a first member disposed above the first opening of the frame and including a first portion surrounding at least one second opening and a second portion disposed in the second opening and physically separated from the first portion; and a second member disposed on the first member and including a first connecting portion connected to the frame and a second mesh portion overlapping the second portion.

The second portion may be configured to create a hole in a deposition film made by the deposition mask and may be connected to the second mesh portion.

The second portion may be directly connected to the second mesh portion.

The second portion may be welded to the second mesh portion using a laser.

A stainless steel (SUS) member may be disposed on an edge of the frame, wherein the SUS member may be connected to the frame.

The first member may include an open sheet having a first thickness based on one surface of the frame; the second member may include a metal sheet having a second thickness based on one surface of the open sheet; and the SUS member may have a third thickness based on the one surface of the frame, wherein the third thickness may be greater than a total sum of the first thickness and the second thickness.

The difference between the third thickness and the total sum of the first thickness and the second thickness may be at least about 600 μm.

The SUS member may be welded to the frame.

The second portion may have a generally circular cross-sectional shape.

The first connecting portion may be directly connected and welded to the frame.

The first connecting portion may include a metal connecting portion having a generally rectangular shape; and the second mesh portion may include a metal mesh portion having a generally mesh shape.

The metal mesh portion may include: a first line extending in one direction; and a second line extending in another direction intersecting the one direction.

A connecting pattern may be disposed between the second mesh portion and the second portion, wherein the connecting pattern is directly connected to the second mesh portion and the second portion.

According to another aspect of the invention, a deposition mask for making a display device includes: a frame including a first opening; a first member disposed above the first opening of the frame and including at least one second opening; and a second member disposed on the first member and including a first connecting portion connected to the frame and a second supporting portion disposed adjacent to the first connecting portion and overlapping the second opening, wherein the second supporting portion includes a second mesh portion and a plug surrounded by the second mesh portion.

A stainless steel (SUS) member may be disposed on an edge of and connected to the frame.

The first member may include an open sheet having a first thickness based on one surface of the frame; the second member may include a metal sheet having a second thickness based on one surface of the open sheet; the second supporting portion may include a metal main part; the first connecting portion may include a metal connecting portion, the second mesh portion may include a metal mesh portion; and the SUS member may have a third thickness based on the one surface of the frame; wherein the third thickness may be greater than the total sum of the first thickness and the second thickness, and the difference between the third thickness and the total sum of the first thickness and the second thickness may be at least about 600 µm.

The plug may include a deposition blocking part having a generally circular cross-sectional shape.

According to a further aspect of the invention, a method of manufacturing a deposition mask for making a display device includes the steps of: providing an open sheet having a first portion surrounding at least one opening, a second portion disposed in the at least one opening, and a third portion connecting the first portion and the second portion; disposing a metal sheet having a metal mesh portion on the open sheet; and welding the metal mesh portion and the second portion and removing the third portion from the open sheet.

The steps of welding of the metal mesh portion and the second portion and removing the third portion from the open sheet are performed using a laser.

According to another aspect of the invention, a method of manufacturing a display device includes the steps of: providing a deposition mask including a frame having a first opening, an open sheet disposed above the first opening of the frame and having a first portion surrounding at least one second opening and a second portion disposed in the second opening and physically separated from the first portion, and a metal sheet disposed on the open sheet and having a metal connecting portion connected to the frame and a metal mesh portion overlapping the second portion and having deposition openings therein; disposing a target substrate in a position spaced apart from the metal mesh portion by a gap; depositing a deposition material on the target substrate through the deposition openings in the metal mesh portion; and forming a deposition film including a third opening formed by a part that overlaps the second portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 22 is a pictorial table depicting films deposited according to a gap between a metal sheet and a target substrate.

DETAILED DESCRIPTION

Figure 1:
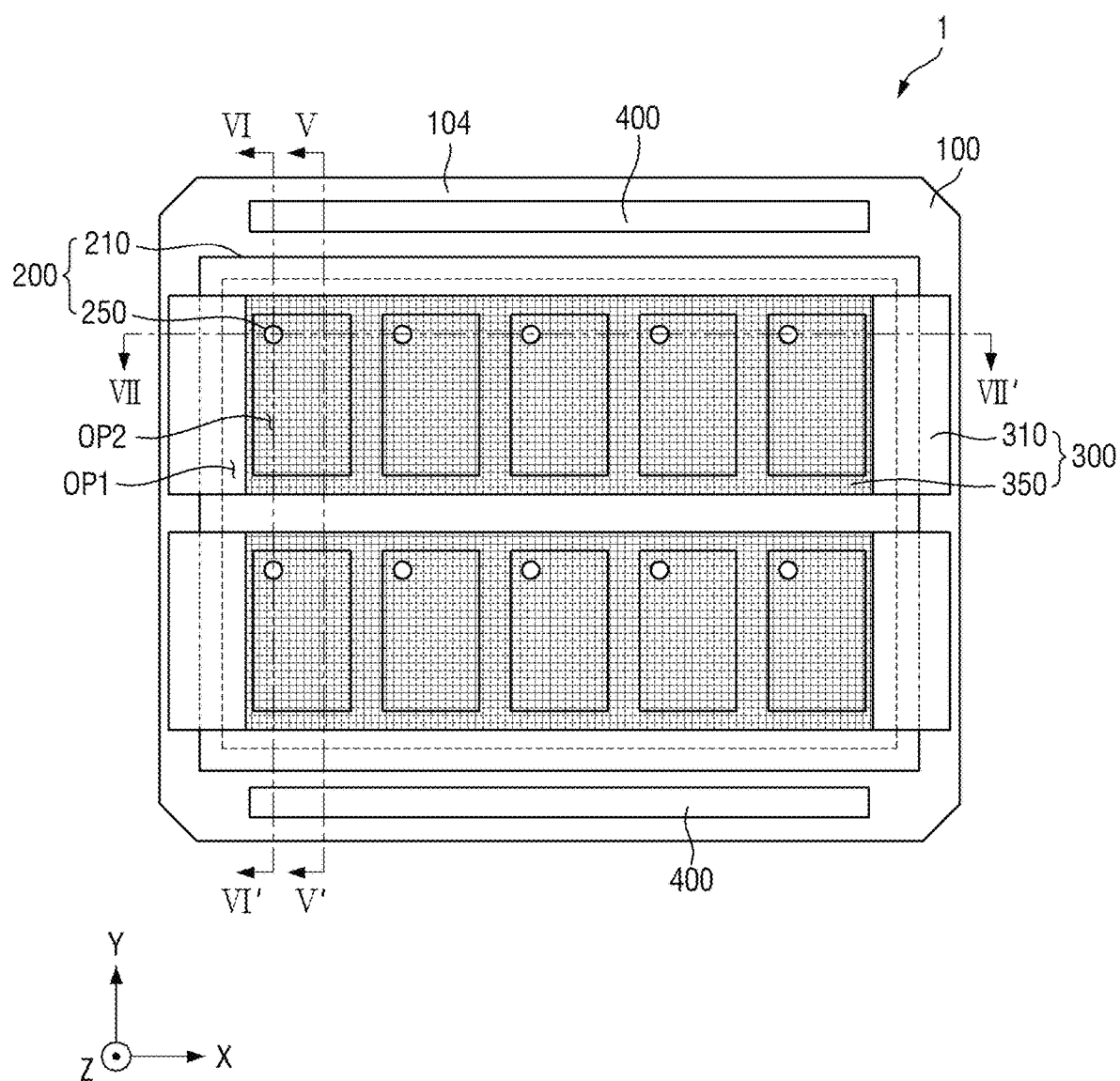
FIG. 1 is a plan view of an exemplary embodiment illustrating a deposition mask constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
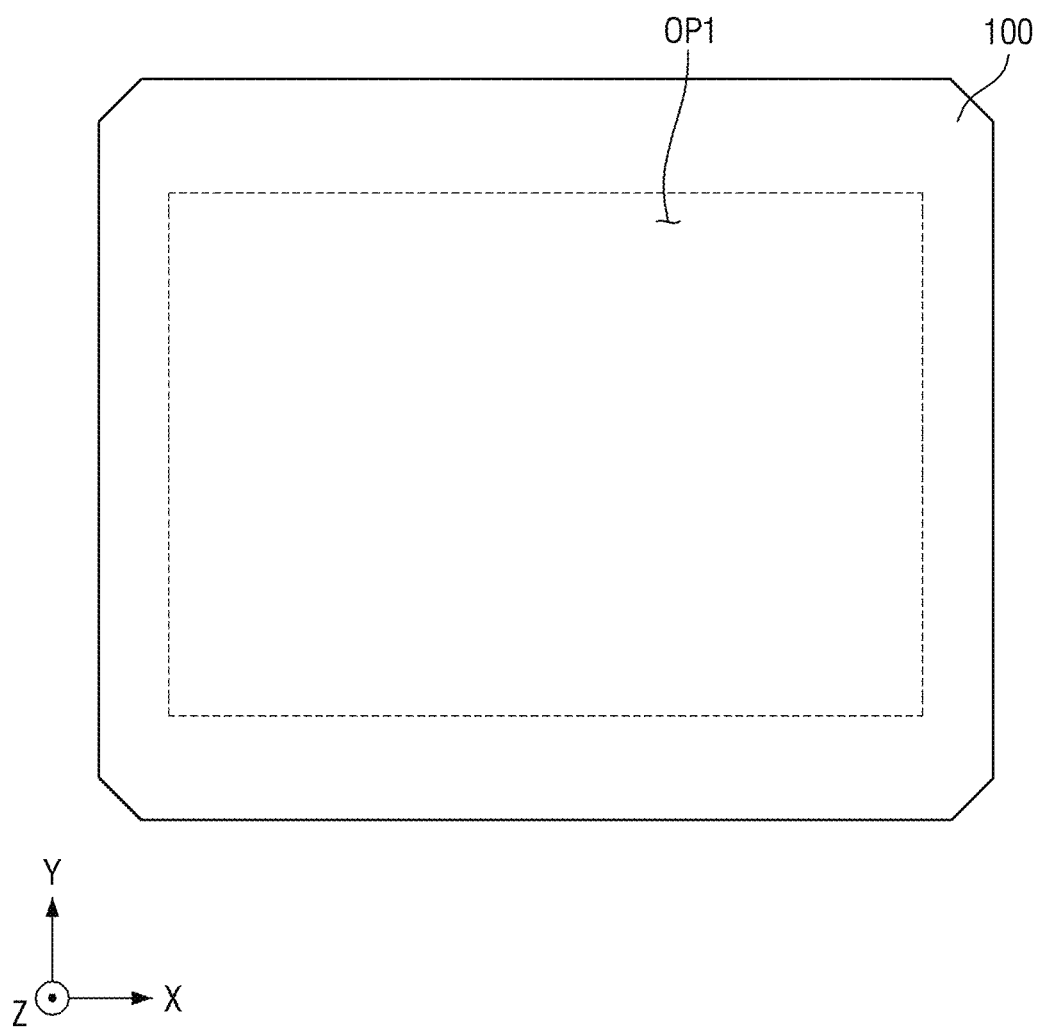
FIG. 2 is a plan view illustrating an exemplary embodiment of the frame of FIG. 1.
Figure 3:
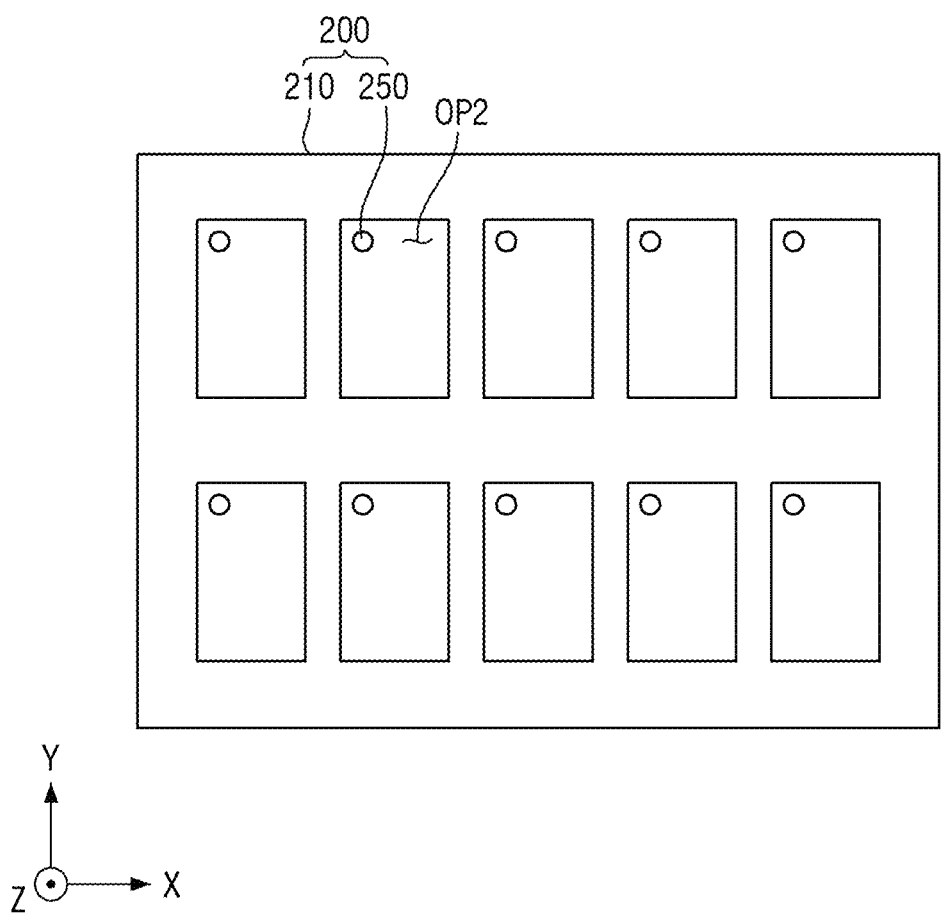
FIG. 3 is a plan view illustrating an exemplary embodiment of the open sheet of FIG. 1.
Figure 4:
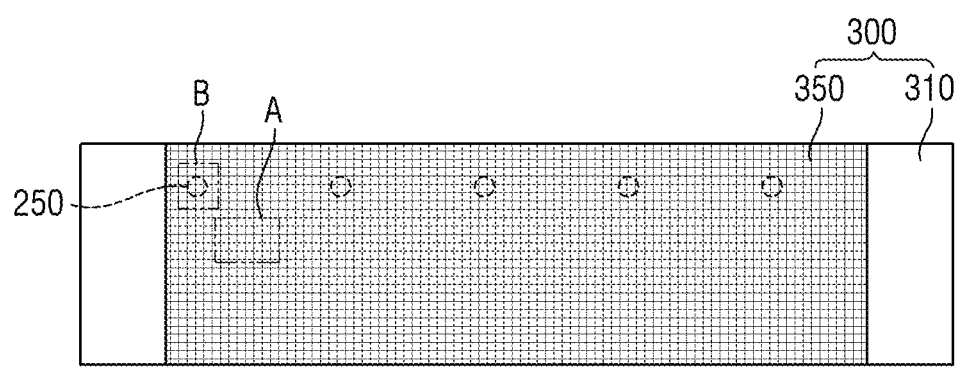
FIG. 4 is a plan view illustrating an exemplary embodiment of the metal sheet of FIG. 1.
Figure 5:
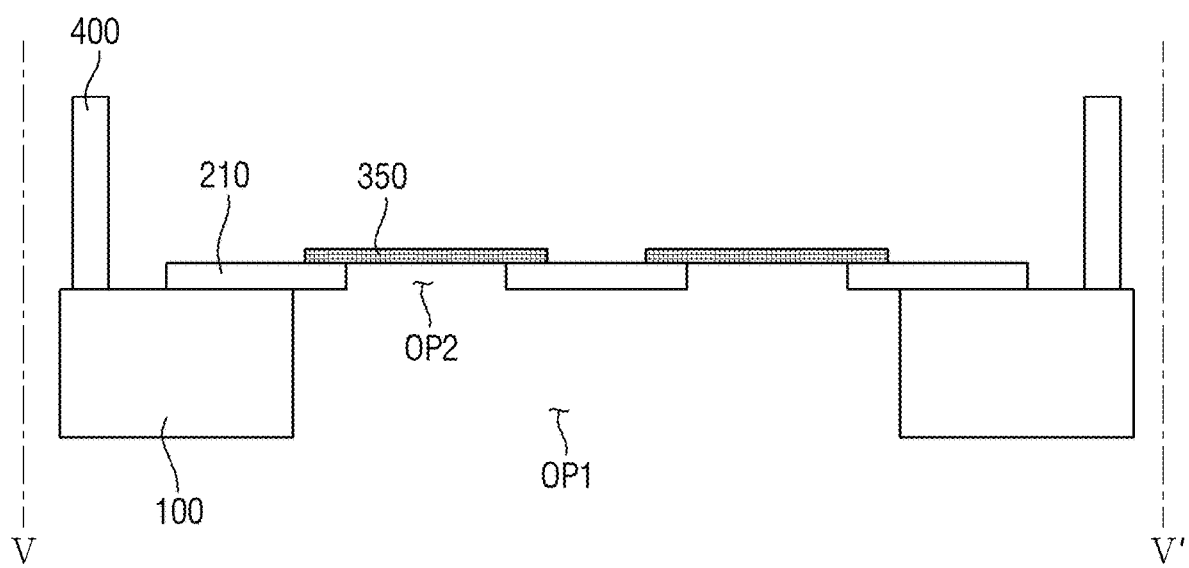
FIG. 5 is a cross-sectional view taken along line V-V' of FIG. 1.
Figure 6:
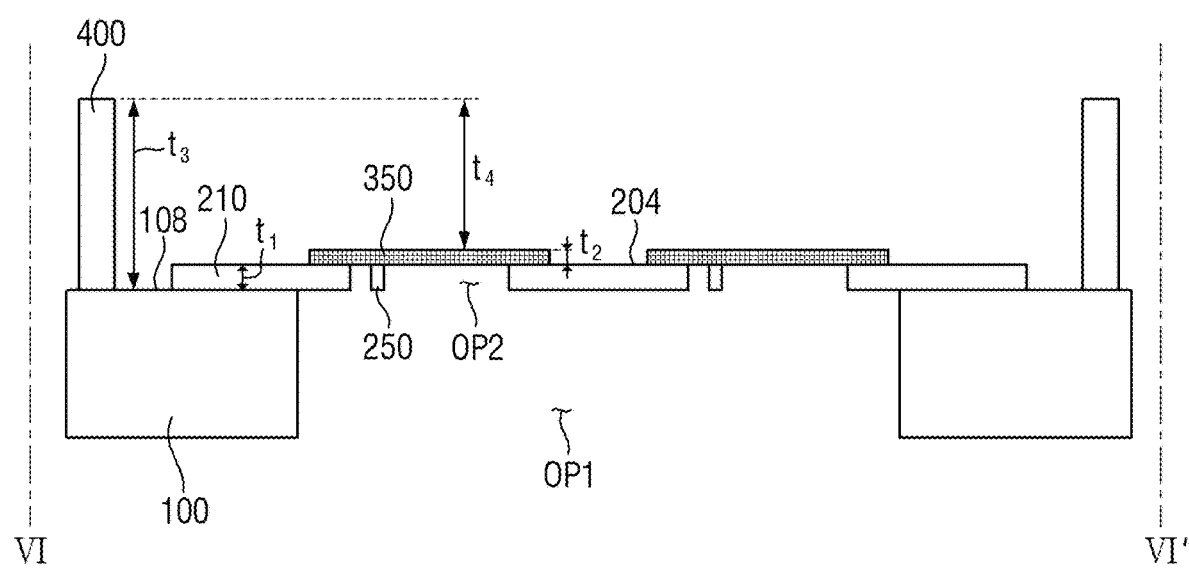
FIG. 6 is a cross-sectional view taken along line VI-VI' of FIG. 1.
Figure 7:
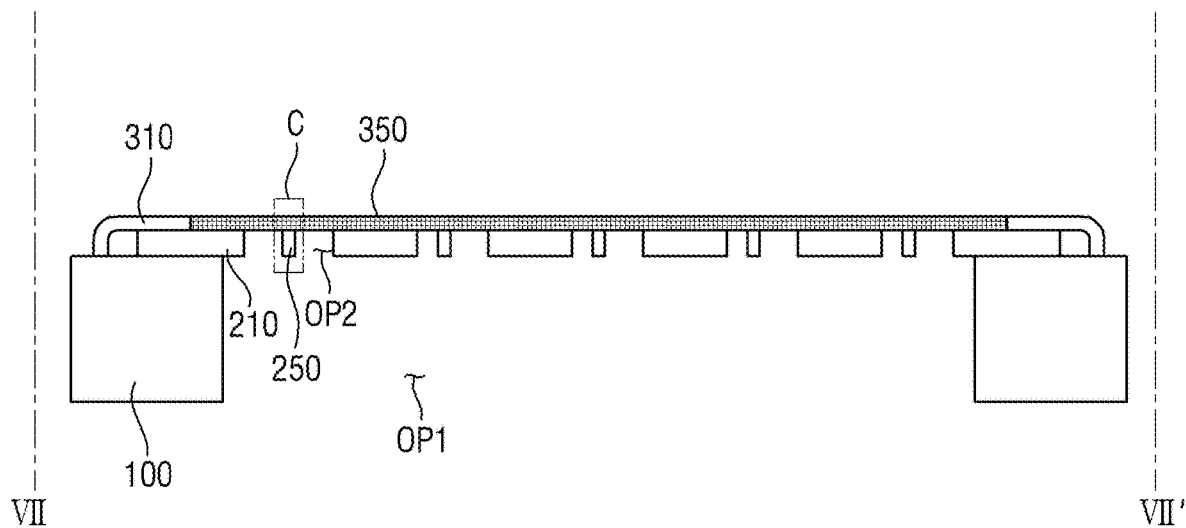
FIG. 7 is a cross-sectional view taken along line VII-VII' of FIG. 1.
Figure 8:
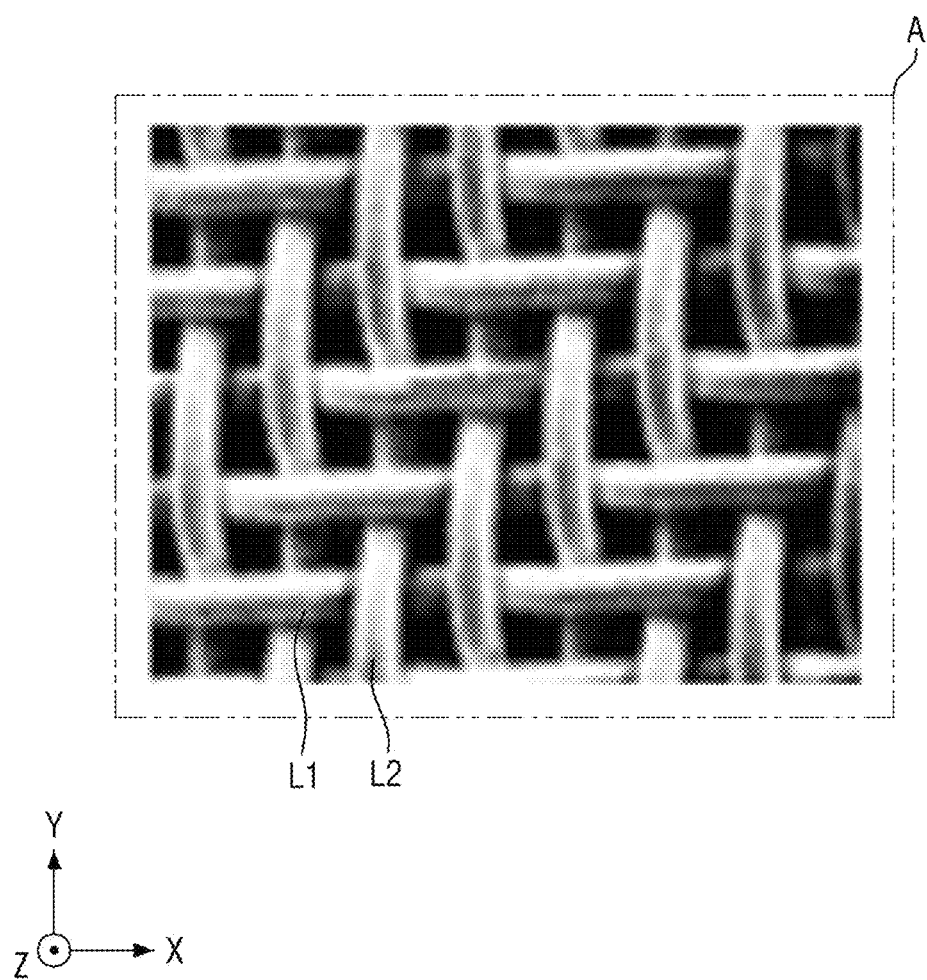
FIG. 8 is an enlarged plan view illustrating region A of FIG. 4.
Figure 9:
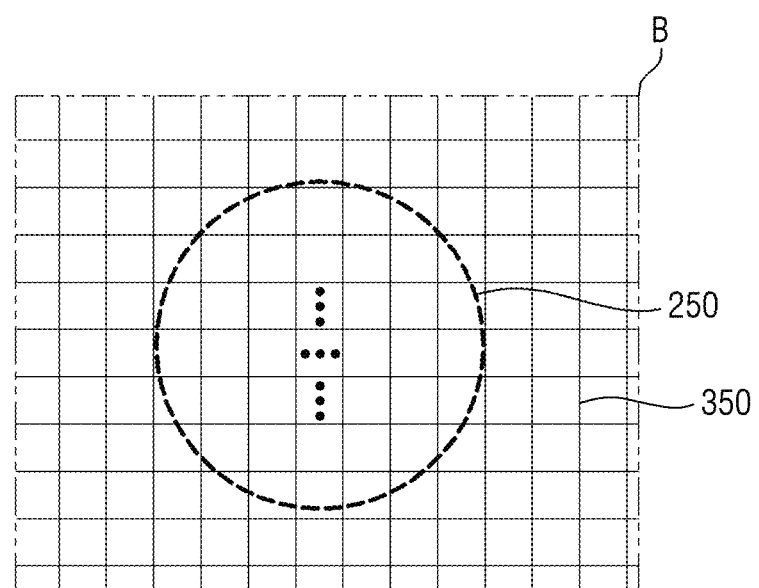
FIG. 9 is an enlarged plan view illustrating region B of FIG. 4.
Figure 10:
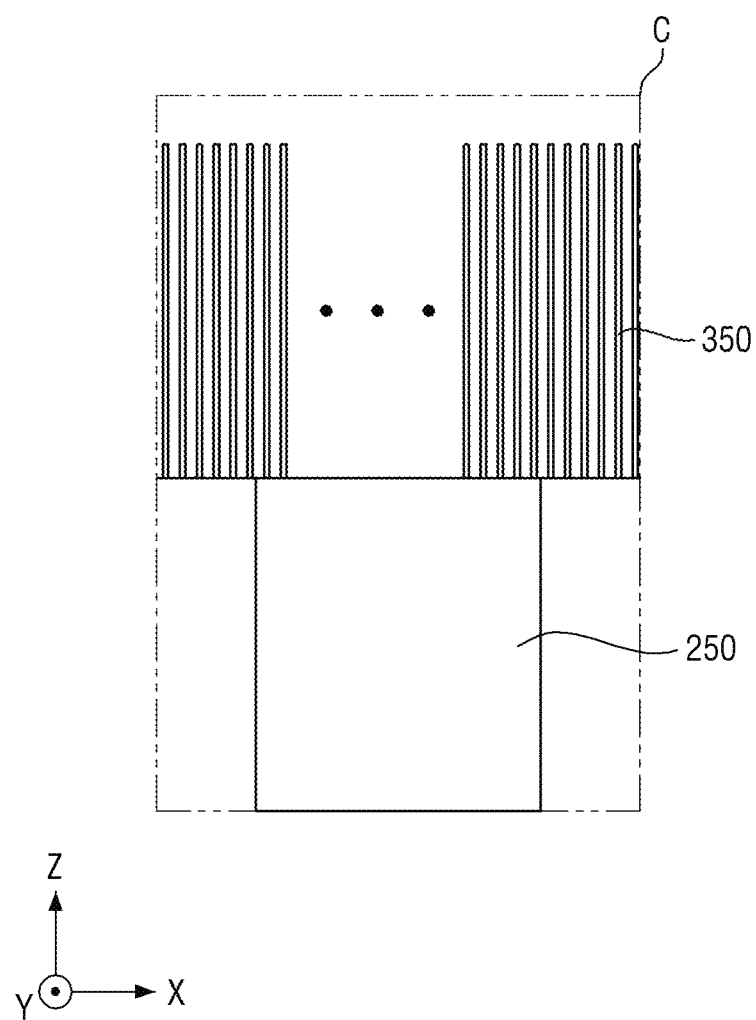
FIG. 10 is an enlarged cross-sectional view illustrating region C of FIG. 7.

FIG. 1 is a plan view of an exemplary embodiment illustrating a deposition mask constructed according to principles of the invention. FIG. 2 is a plan view illustrating an exemplary embodiment of the frame of FIG. 1. FIG. 3 is a plan view illustrating an exemplary embodiment of the open sheet of FIG. 1. FIG. 4 is a plan view illustrating an exemplary embodiment of the metal sheet of FIG. 1. FIG. 5 is a cross-sectional view taken along line V-V' of FIG. 1. FIG. 6 is a cross-sectional view taken along line VI-VI' of FIG. 1. FIG. 7 is a cross-sectional view taken along line VII-VII' of FIG. 1. FIG. 8 is an enlarged plan view illustrating region A of FIG. 4. FIG. 9 is an enlarged plan view illustrating region B of FIG. 4. FIG. 10 is an enlarged cross-sectional view illustrating region C of FIG. 7. In FIG. 4, second portions 250 are illustrated for the sake of convenience in the description.

The deposition mask constructed according to exemplary embodiments of the invention may be used in a deposition process of depositing an organic layer or an inorganic layer in a portable electronic device such as a mobile phone, a smart phone, a tablet personal computer (PC), a smart watch, a watch phone, a mobile communication terminal, a digital assistant, an eBook, a portable multimedia player (PMP), a navigation system, an ultra-mobile PC (UMPC), or the display device of a television set, a notebook, a monitor, a billboard, or an Internet of Things device. For example, the deposition mask may be used to deposit an organic light-emitting layer of an organic light-emitting display device or an organic thin film for a hole injection/transmission layer, an electron injection/transmission layer, and the like and may also be used to deposit other organic films, inorganic films, metal patterns, and the like. The deposition mask may be an open mask including openings having a pattern which is the same as a pattern of a thin film which will be formed on a target substrate.

Referring to FIGS. 1 to 10, a deposition mask 1 includes a frame 100, a first member, which may be in the form of an open sheet 200 disposed on the frame 100 and a second member, which may be in the form of one or more metal sheets 300 disposed on the open sheet 200. The deposition mask 1 according to one exemplary embodiment may further include one or more stainless steel (SUS) members 400 disposed on the frame 100.

First, referring to FIGS. 1 and 2, the frame 100 may include a first opening OP1. The frame 100 may serve to fix the open sheet 200 and the metal sheets 300. The frame 100 may be connected to the open sheet 200 and the metal sheets 300 and may also be directly connected thereto. For example, the frame 100 may be connected to the open sheet 200 and the metal sheets 300 through a welding process. The frame 100 may have a generally quadrilateral frame form in which the first opening OP1 is formed at or near a center thereof. The frame 100 may include two short side frames which have predetermined widths and extend in one direction and two long side frames which extend in the other direction intersecting the one direction.

The two short side frames and the two long side frames may completely surround the first opening OP1 when viewed from a Z-axis-direction, e.g., above. The frame 100 may be formed of a metal material having high strength, for example, stainless steel.

The open sheet 200 may be disposed on the frame 100. As illustrated in FIG. 3, the open sheet 200 may include a first portion 210 and a second opening OP2 surrounded by the first portion 210 when viewed from above. The second opening OP2 may be provided as a plurality of second openings OP2. The plurality of second openings OP2 may be arranged in the one direction and the other direction. The first portion 210 may completely surround the plurality of second openings OP2 when viewed from above. The generally planar shape of the first portion 210 may be a generally lattice shape but is not limited thereto.

As depicted, five second openings OP2 are disposed in the one direction and two second openings OP2 are disposed in the other direction, for a total of 10 second openings OP2, but the number of the second openings OP2 in the one direction and the other direction is not limited thereto.

The open sheet 200 may further include the second portions 250 which are physically separated from the first portion 210 and disposed in the second openings OP2 when viewed from above. The first portion 210 and the second portions 250 may be disposed to be coplanar and formed of the same material.

The generally planar shape of the second opening OP2 may correspond to the generally planar shape of a deposition film, which is deposited through the second opening OP2, of the display device as described below. The generally planar shape of the deposition film may roughly correspond to the generally planar shape of the display device. The generally planar shape of the display device may be a generally rectangular shape having generally angular corners, but is not limited thereto, and may be a generally rectangular shape having generally rounded corners, a generally square shape, a generally circular shape, a generally oval shape, or another generally polygonal shape.

As illustrated in FIG. 3, the generally planar shape of a second portion 250 may be a generally circular shape. The second portion 250 may serve to form a hole of the deposition film at a portion corresponding to the second portion 250 during a deposition process for the deposition film of the display device. The display device may include a sensor corresponding to the hole of the deposition film. The sensor may be an under panel sensor (UPS) or an under panel camera (UPC) which is disposed under a panel of the display device and corresponds to the hole of the deposition film, but is not limited thereto.

In the deposition mask 1 according to some exemplary embodiments, as the second portion 250 is physically separated from the first portion 210 and serves to form the hole of the deposition film, a plurality of deposition masks or a connecting member which connects the second portion 250 and the first portion 210, for example, a generally thin bar, is not necessary to form the hole of the deposition film during the deposition process for the deposition film of the display device.

When a plurality of deposition masks are used to form the hole of the corresponding deposition film, the process time and process cost is increased. When the connecting member which connects the second portion 250 and the first portion 210, for example, a thin bar is used to form the hole of the corresponding deposition film, a dark line and the like may be visible from the deposition film due to the connecting member thereby resulting in a visual defect.

However, since the deposition mask 1 according to one exemplary embodiment includes the above-described second portion 250, the hole of the corresponding deposition film may be formed using only one open mask, and the dark line on the deposition film due to the connecting member, which connects the second portion 250 and the first portion 210, may be prevented from being visible.

The second portion 250 separated from the first portion 210 may be connected to the metal sheet 300. The metal sheet 300 may include a metal material. As illustrated in FIGS. 1 and 4, the metal sheet 300 may have a generally elongated shape that extends in one direction.

The metal sheets 300 may include one or more first connecting portions, which may be in the form of metal connecting portions 310 connected to the frame 100 and one or more second mesh portions, which may be in the form of metal mesh portions 350 disposed adjacent to the metal connecting portions 310. The metal connecting portions 310 may be disposed to overlap the frame 100 and the first opening OP1 of the frame 100 and may be disposed to overlap the first portion 210 of the open sheet 200.

The metal mesh portion 350 may be disposed to overlap the second opening OP2 of the open sheet 200 and a part of the first portion 210 adjacent to the second opening OP2 and may be disposed to overlap the second portion 250 as illustrated in FIG. 9. The metal connecting portion 310 may have a generally rectangular shape, and the metal mesh portion 350 may have a generally mesh shape.

As described above, the second portion 250 and the first portion 210 are physically separated from each other, and the second portion 250 may be fixedly connected to the metal mesh portion 350. The second portion 250 may be directly connected to the metal mesh portion 350. For example, the second portion 250 may be welded to the metal mesh portion 350 to be directly connected thereto. Welding between the second portion 250 and the metal mesh portion 350 may be performed using a laser.

Referring to FIG. 8, the metal mesh portion 350 may include a first line L1 which extends in one direction, e.g., Y-direction, and a second line L2 which extends in another direction, e.g., X-direction. The first line L1 and the second line L2 may be respectively provided as a plurality of first lines L1 and a plurality of second lines L2. The plurality of first lines L1 may be arranged in one direction and the plurality of second lines L2 may be arranged in the other direction.

The first line L1 may extend while being interlaced with the plurality of second lines L2, and the second line L2 may extend while being interlaced with the plurality of first lines L1. For example, the first line L1 may extend while being interlaced with the plurality of second lines L2 in a manner in which the first line L1 extends under one of the plurality of second lines L2 and extends above another one of the plurality of second lines L2 adjacent to the one. Similarly, the second line L2 may extend while being interlaced with the plurality of first lines L1 in a manner in which the second line L2 extends under one of the plurality of first lines L1 and extends above another one of the plurality of first lines L1 adjacent to the one.

The metal mesh portion 350 may have a generally mesh shape in which the plurality of first lines L1 and the plurality of second lines L2 are interlaced and a portion surrounded by the generally mesh shape may be a mesh opening. A deposition material may pass through the mesh opening, and the deposition material may not pass through a portion in which the plurality of first lines L1 and the plurality of second lines L2 are disposed.

The SUS members 400 may be disposed on an edge region 104 of the two short side frames of the frame 100. As depicted in the illustrated embodiment of FIG. 1, two SUS members 400 are disposed on two short side frames of the frame 100, but the exemplary embodiments are not limited thereto, and the number of the SUS members 400 may be one, or three or more.

The SUS member 400 may serve to maintain a predetermined gap between the metal mesh portion 350 and the target substrate which will be described below. That is, the SUS member 400 may have a thickness capable of maintaining the predetermined gap between the metal mesh portion 350 and the target substrate.

The SUS members 400 may be directly connected to the two short side frames of the frame 100. For example, the SUS members 400 may be fixedly directly welded to the two short side frames of the frame 100. Accordingly, when the deposition process is performed on the target substrate, movement of the target substrate positioned above the SUS members 400 due to the moving of SUS members 400 may be prevented.

The SUS member 400 may include stainless steel but is not limited thereto and may include any material which has strength capable of maintaining the predetermined gap between the metal mesh portion 350 and the target substrate and is weldable to the frame 100.

Referring to FIGS. 5 and 6, in the frame 100, one short side frame (upper short side frame of FIG. 1) is spaced apart from the other short side frame (lower short side frame of FIG. 1) with the first opening OP1 therebetween.

The open sheet 200 may be disposed on the frame 100. The first portion 210 may be disposed on one surface of the frame 100. The first portion 210 may be directly disposed on one surface of the frame 100 to overlap the first opening OP1.

In FIGS. 5 and 6, the first portion 210 may have a substantially lattice shape in which the divided first portions 210 are integrally connected when viewed from above.

In FIGS. 5 and 6, the second openings OP2 may be defined between the divided first portions 210 disposed to be spaced apart from each other. The second openings OP2 may be disposed in or over the first opening OP1 when viewed from above.

As described above, the open sheet 200 may further include the second portions 250 disposed in the second openings OP2, and the second portions 250 are disposed to be coplanar with the first portions 210 and typically made of the same material thereof.

The metal sheet 300 may be disposed on the open sheet 200. The metal mesh portion 350 of the metal sheet 300 may be disposed to overlap the second opening OP2 and the first opening OP1. The metal mesh portion 350 may extend to be longer than the second opening OP2 so as to partially overlap the first portion 210.

The metal sheet 300 may be directly disposed on the open sheet 200. The metal mesh portion 350 of the metal sheet 300 may directly disposed on the first portion 210 and the second portion 250 of the open sheet 200, which may have one surface 204. The metal mesh portion 350 and the second portion 250 may be directly connected through a process such as a welding process as described above. That is, although the second portion 250 is physically separated from the first portion 210, the second portion 250 may be directly and fixedly welded to the metal mesh portion 350. The SUS members 400 may be disposed on two short side frames of the frame 100.

The open sheet 200 may have a first thickness t1, the metal sheet 300 may have a second thickness t2, the SUS member 400 may have a third thickness t3, and a difference between the third thickness t3 and a total sum of the first thickness t1 and the second thickness t2 may be a fourth thickness t4.

The first thickness t1 may range, for example, from about 100 μm to about 200 μm, and the second thickness t2 may range, for example, from about 20 μm to about 40 μm.

The third thickness t3 may be greater than the total sum of the first thickness t1 and the second thickness t2. Accordingly, a gap between the target substrate, which will be disposed on the SUS member 400, and the metal sheet 300 may be maintained.

The third thickness t3 may be set by considering the fourth thickness t4.

The third thickness t3 may be set in a range such that the fourth thickness t4 is at least about 600 μm. The third thickness t3 and the gap between the target substrate and the metal sheet 300 will be described in detail below.

Referring to FIG. 7, the two long side frames of the frame 100 of FIG. 1 are illustrated.

The metal connecting portion 310 may be connected to the frame 100. A part of the metal connecting portion 310 may be bent in the thickness direction due to a step difference between the metal connecting portion 310 and the first portion 210 and may be connected to the frame 100. The metal connecting portion 310 may be directly connected to the first portion 210. For example, the metal connecting portion 310 may be directly connected to the first portion 210 through a method such as a welding method.

Referring to FIG. 10, the metal mesh portion 350 may be directly connected to the second portion 250. The metal mesh portion 350 may include the above-described plurality of first lines L1 and the second lines L2. As illustrated in FIG. 10, in the metal mesh portion 350, a plurality of patterns may be directly connected to the second portion 250. The plurality of patterns may be formed of at least one of the plurality of first lines L1 and the plurality of second lines L2.

As described above, in the deposition mask 1 according to the illustrated exemplary embodiment, the second portion 250 is physically separated from the first portion 210 and serves to form the hole of the deposition film, and thus a plurality of deposition masks or a connecting member which connects the second portion 250 and the first portion 210, for example, a thin bar, may not be used to form the hole of the corresponding deposition film during the deposition process for the deposition film of the display device.

When the plurality of deposition masks are used to form the hole of the corresponding deposition film, the process time and process cost may increase. In addition, when the connecting member which connects the second portion 250 and the first portion 210, for example, a thin bar, is used to form the hole of the corresponding deposition film, a dark line and the like may be visible from the deposition film due to the connecting member, and thereby a visual defect may occur.

However, since the deposition mask 1 according to one illustrated embodiment includes the above-described second portion 250, the hole of the corresponding deposition film may be formed using only one open mask, and the dark line on the deposition film due to the connecting member which connects the second portion 250 and the first portion 210 may be prevented from being visible.

Hereinafter, a method of manufacturing the above-described deposition mask will be described. Detailed descriptions of the components which are the same as or similar to those of the above-described embodiment will be omitted to avoid redundancy.

Figure 11:
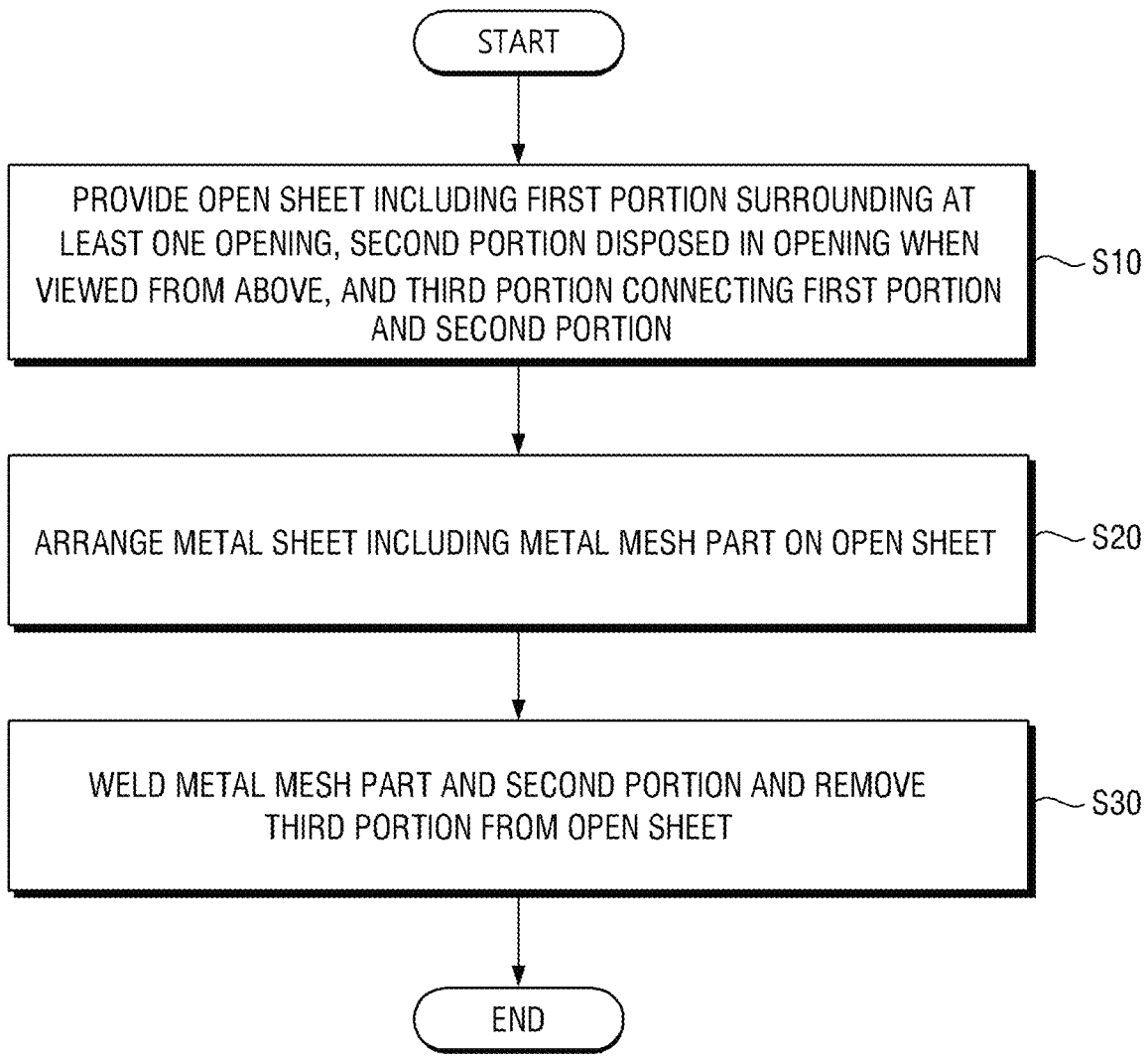
FIG. 11 is a flowchart illustrating the steps of an exemplary method of manufacturing a deposition mask according to principles of the invention.
Figure 15:
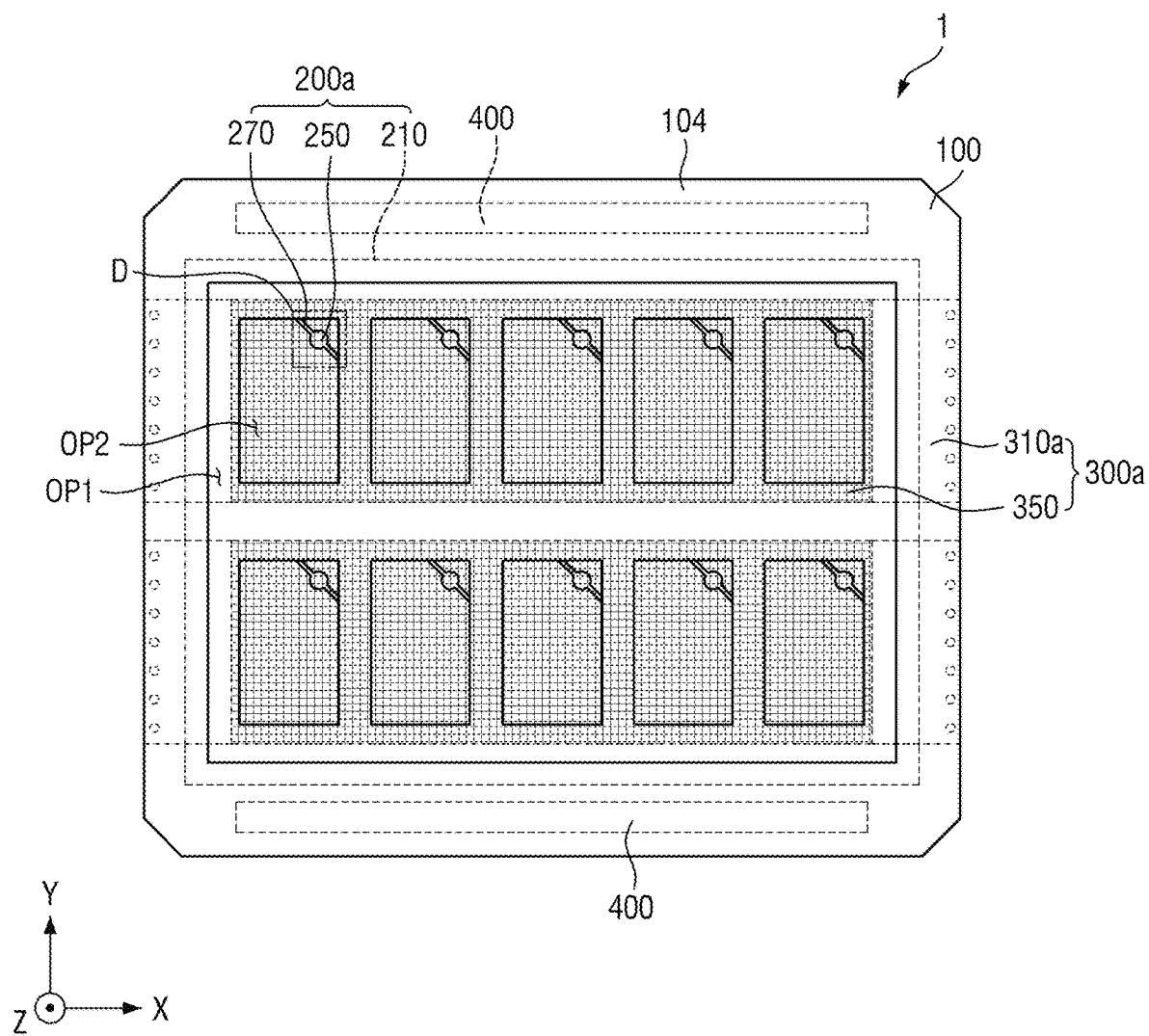
Figure 16:
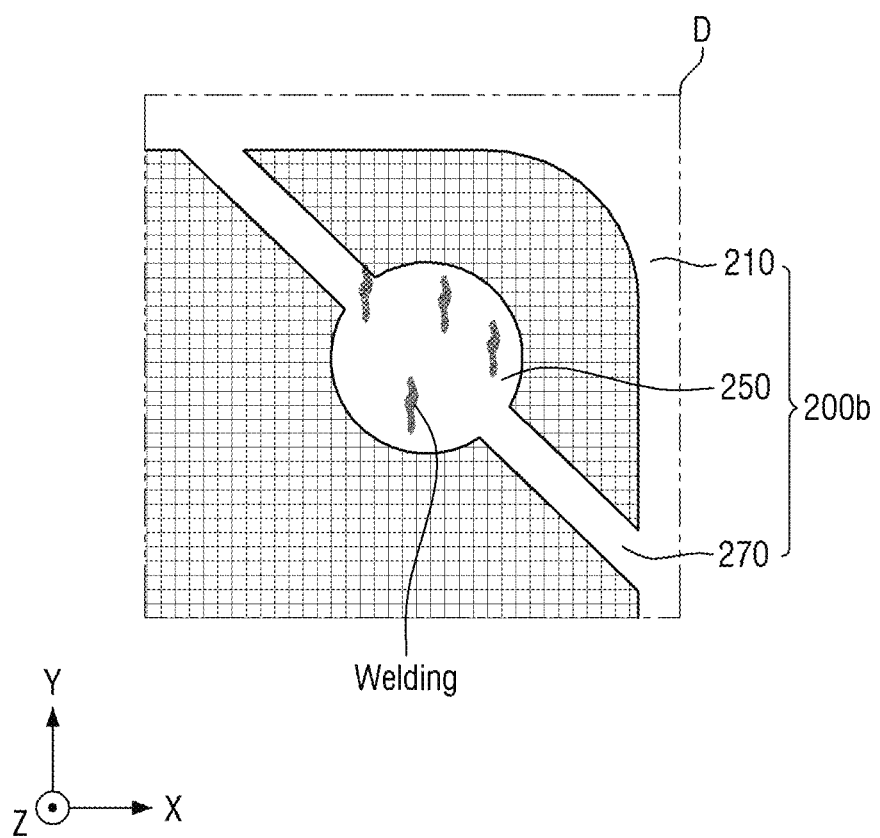
FIG. 16 is an enlarged plan view illustrating region D of FIG. 15.
Figure 17:
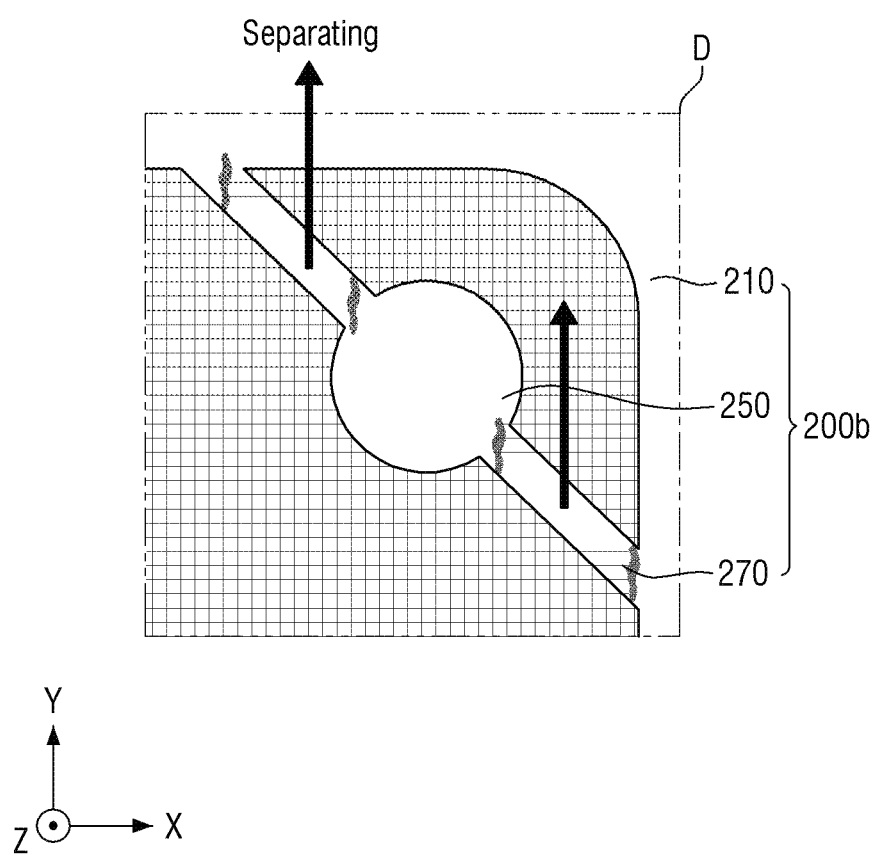
FIGS. 17 and 18 are enlarged plan views of region D of FIG. 15 illustrating exemplary steps in a method of manufacturing a deposition mask according to principles of the invention.
Figure 18:
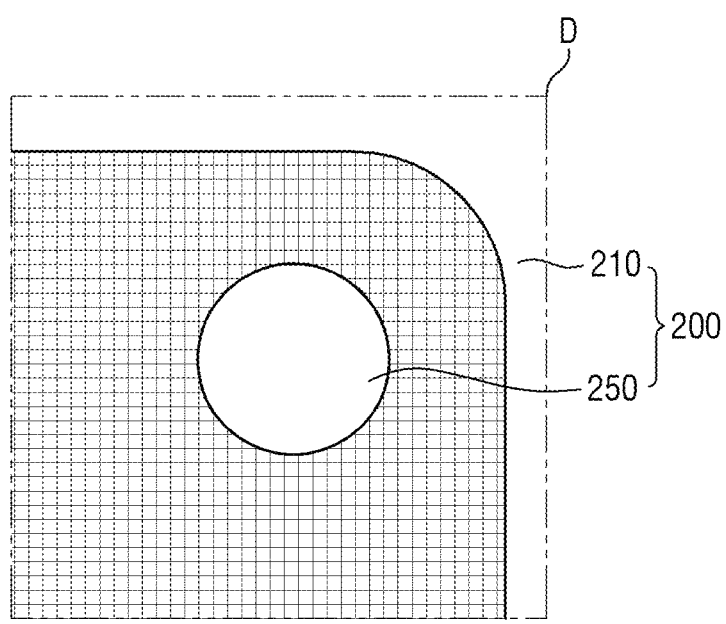

FIG. 11 is a flowchart illustrating the steps of an exemplary method of manufacturing a deposition mask according to principles of the invention. FIGS. 12 to 15 are plan views illustrating exemplary steps in a method of manufacturing a deposition mask according to principles of the invention. FIG. 16 is an enlarged plan view illustrating region D of FIG. 15. FIGS. 17 and 18 are enlarged plan views of region D of FIG. 15 illustrating exemplary steps in a method of manufacturing a deposition mask according to principles of the invention.

Figure 12:
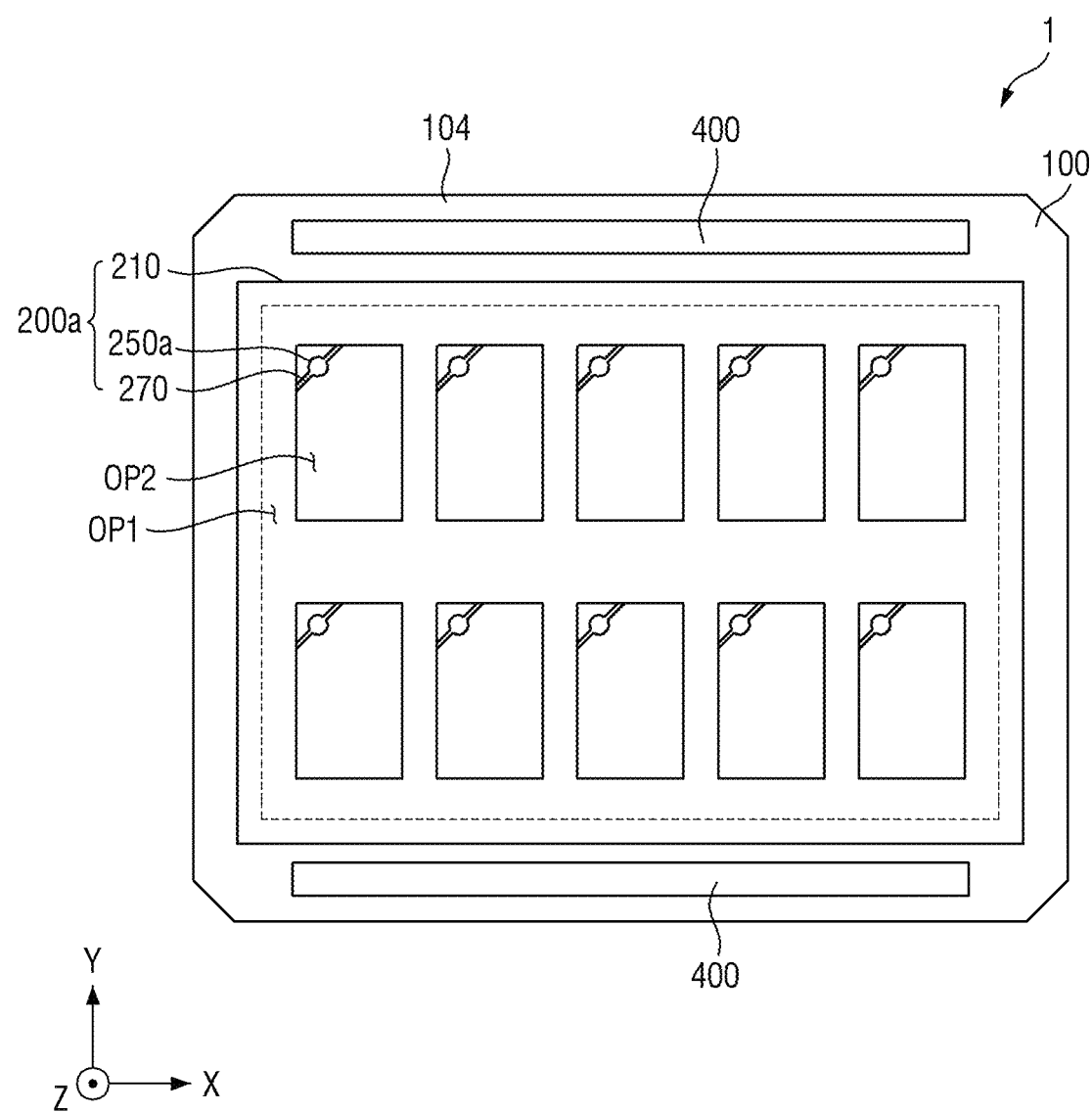
FIGS. 12 to 15 are plan views illustrating exemplary steps in a method of manufacturing a deposition mask according to principles of the invention.

First, referring to FIGS. 11 and 12, an open sheet 200a including a first portion 210 which surrounds at least one opening, second portions 250a disposed in the opening when viewed from above, and third portions 270 which connect the first portion 210 and the second portions 250a are provided (S10). The frame 100 illustrated in FIGS. 1 and 2 may be further disposed under the open sheet 200a.

A third portion 270 may be disposed between the second portion 250a and the first portion 210 and may serve to connect the second portion 250a and the first portion 210. The third portion 270 may be coplanar with the second portion 250a and the first portion 210 and be formed of the same material thereof.

Since the second portion 250a is the same as the second portion 250 illustrated in FIGS. 1 and 3 except that the second portion 250a is connected to the first portion 210 by the third portion 270, repetitive descriptions thereof will be omitted to avoid redundancy.

The third portion 270 may connect one side of the second portion 250a and the first portion 210 and connect the other side thereof, which is the side opposite to the one side of the second portion 250a, and the first portion 210.

The third portions 270 may be disposed in second openings OP2. That is, the second portion 250a may be physically connected to the first portion 210 by the third portion 270.

Figure 13:
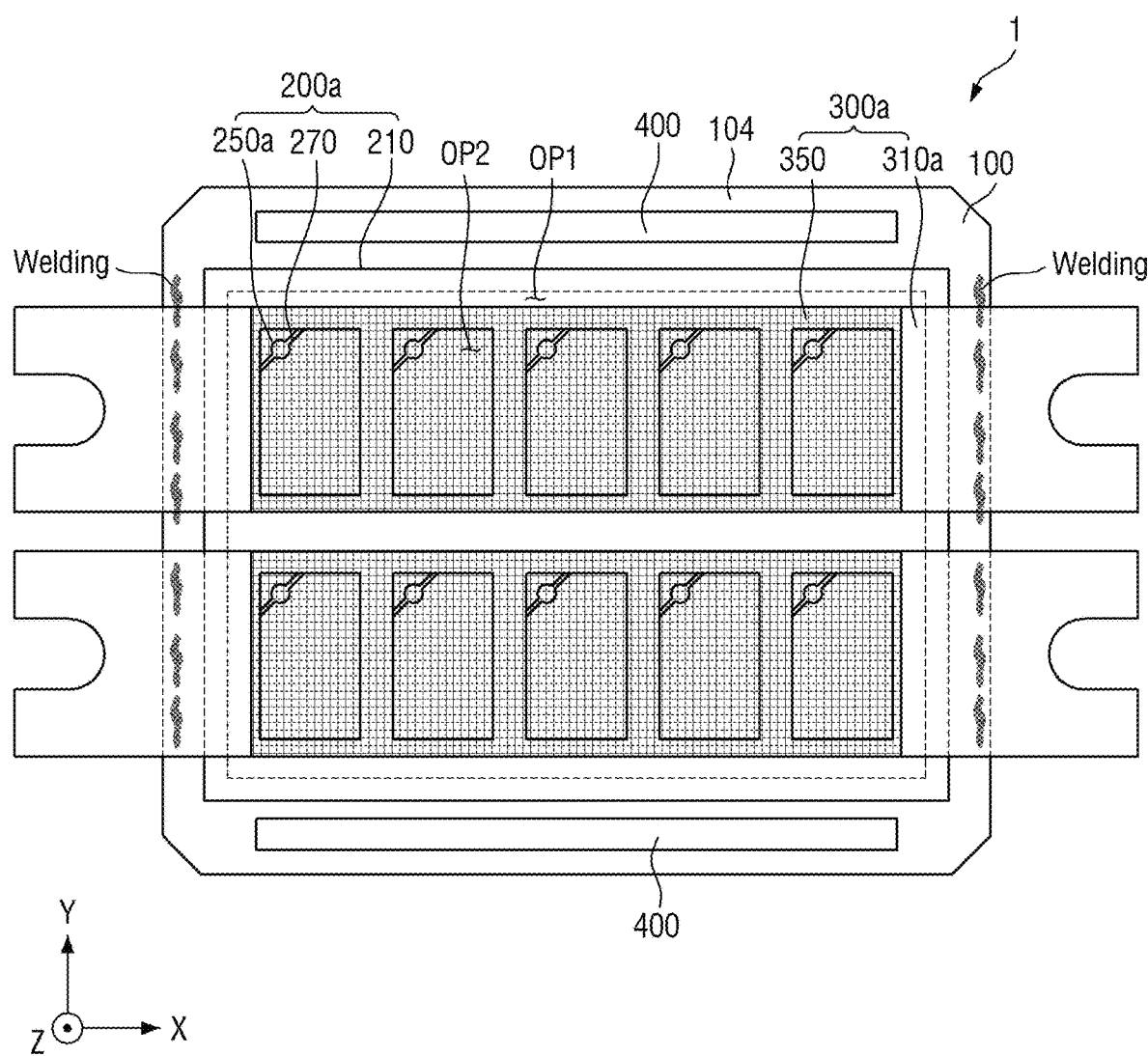

Then, referring to FIGS. 11 and 13, metal sheets 300a including metal mesh portions 350 are disposed on the open sheet 200a (S20). The metal sheets 300a may include metal connecting portions 310a which are disposed at one side and the other side of each of the metal mesh portions 350 and connected to the one side and the other side of each of the metal mesh portions 350.

The operation S20 in which the metal sheets 300a are disposed on the open sheet 200a may include an operation in which the metal sheets 300a are elongated in the one direction and disposed on the open sheet 200a. Accordingly, a phenomenon in which the metal mesh portions 350 of the metal sheets 300a sag and the like can be reduced or prevented.

Figure 14:
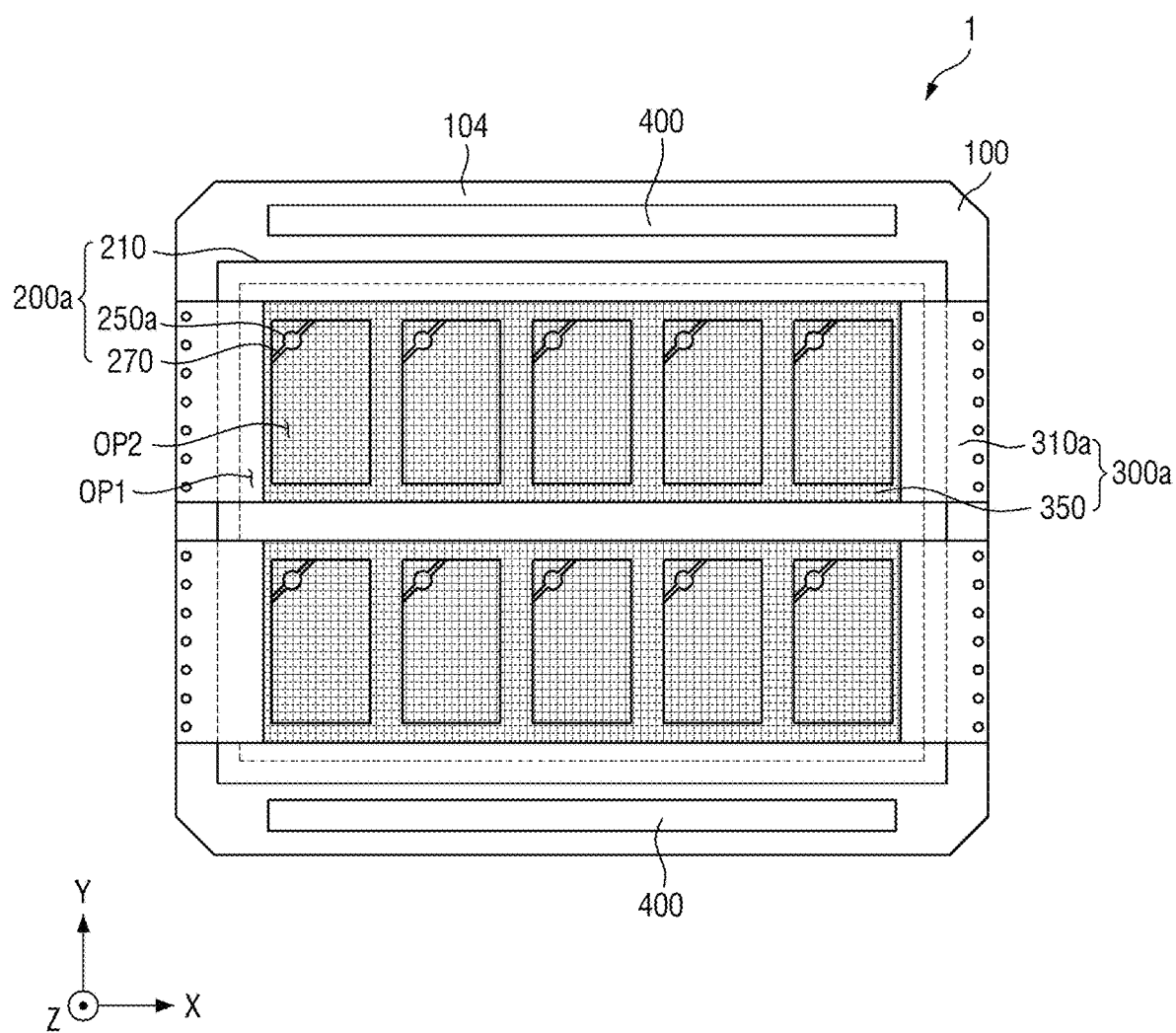

Referring to FIG. 14, after the metal sheets 300a are disposed on the open sheet 200a (S20), an operation in which the metal connecting portions 310a connected to the one side and the other side of each of the metal mesh portions 350 of the metal sheets 300a are welded to the frame 100 may be further included.

The operation in which the metal connecting portions 310a are welded to the frame 100 may be performed using a laser. For example, the laser emits light to the metal connecting portions 310a and the frame 100 to melt at least parts of the metal connecting portions 310a and the frame 100 so as to directly weld the metal connecting portions 310a and the frame 100.

In the operation in which the laser emits the light, the laser may be a spot laser. That is, as illustrated in FIG. 14, the spot laser may emit light on the metal connecting portions 310a and the frame 100 at predetermined intervals in the other direction to weld the metal connecting portions 310a and the frame 100. In FIG. 14, portions in which the metal connecting portions 310a and the frame 100 are welded are disposed in the other direction, but are not limited thereto, and may also be disposed in the one direction or disposed in the other direction and the one direction. In addition, as illustrated, the number of the portions in which the metal connecting portions 310a and the frame 100 are welded is six at the side of one short side frame of the frame 100 and six at the side of the other short side frame, but the number of the welding portions is not limited thereto. In addition, the number of the welding portions of the side of the one short side frame may be different from that of the side of the other short side frame.

Then, portions, which are disposed outside the portions in which the metal connecting portions 310a and the frame 100 are welded, may be removed. When the portions, which are disposed outside the portions in which the metal connecting portions 310a and the frame 100 are welded, are removed, ends of the metal connecting portions 310a may be aligned with ends of the frame 100, but the exemplary embodiments are not limited thereto.

Then, referring to FIG. 15, the frame 100, the open sheet 200a, and the metal sheets 300a are flipped over. That is, the stacking order of the frame 100, the open sheet 200a, and the metal sheet 300a may be changed from that of FIG. 14. Accordingly, the stacking order may be the stacking order of the metal sheet 300a, the open sheet 200a, and the frame 100.

The second portions 250a and the third portions 270A of the open sheet 200a may be externally exposed in a first opening OP1 of the frame 100 and the second openings OP2 of the open sheet 200a.

Then, referring to FIGS. 11, 14, and 16, the second portions 250 and the metal mesh portions 350 are connected (S30). The operation in which the second portions 250 and the metal mesh portions 350 are connected (S30) may include an operation in which the second portions 250 and the metal mesh portions 350 are directly connected. The operation in which the second portions 250 and the metal mesh portions 350 are directly connected may include an operation in which, for example, the second portions 250 and the metal mesh portions 350 are welded.

The operation in which the second portion 250 and the metal mesh portion 350 are welded may be performed using a laser. The laser may be a spot laser. That is, as illustrated in FIG. 16, the spot laser may emit light on the metal mesh portion 350 and the second portion 250 at predetermined intervals in a random direction. In FIG. 16, the number of portions in which the metal mesh portion 350 and the second portion 250 are welded is four, but the number of the welding portions is not limited thereto.

Then, referring to FIGS. 11, 14, 17, and 18, the third portions 270 are removed from the open sheet 200b (S30).

The operation S30 in which the third portions 270 are removed from the open sheet 200b may be performed using a laser. The laser may be a spot laser. That is, as illustrated in FIG. 17, the laser may emit light at boundaries between the first portion 210 and the third portions 270 and boundaries between the third portions 270 and the second portions 250 to remove the third portions 270 from the open sheet 200b.

Accordingly, as illustrated in FIGS. 9 and 18, the second portions 250 may be directly connected to the metal mesh portion 350. Hereinafter, a method of manufacturing the display device using the above-described deposition mask 1 according to one illustrated embodiment will be described. Detailed descriptions of the components which are the same as or similar to those of the above-described embodiment will be omitted to avoid redundancy.

Figure 19:
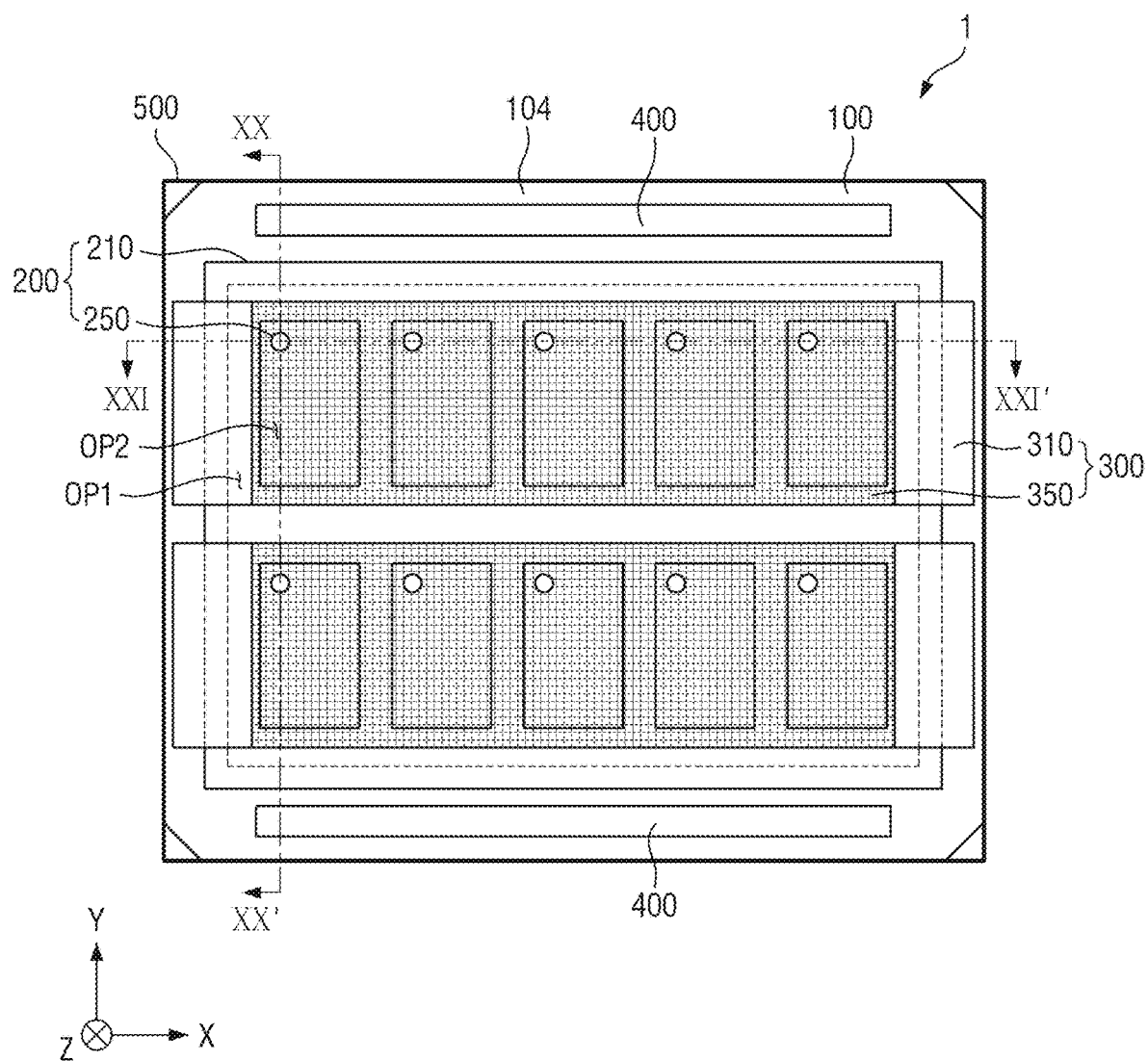
FIG. 19 is a plan view illustrating an exemplary step in a method of manufacturing a display device according to principles of the invention.
Figure 20:
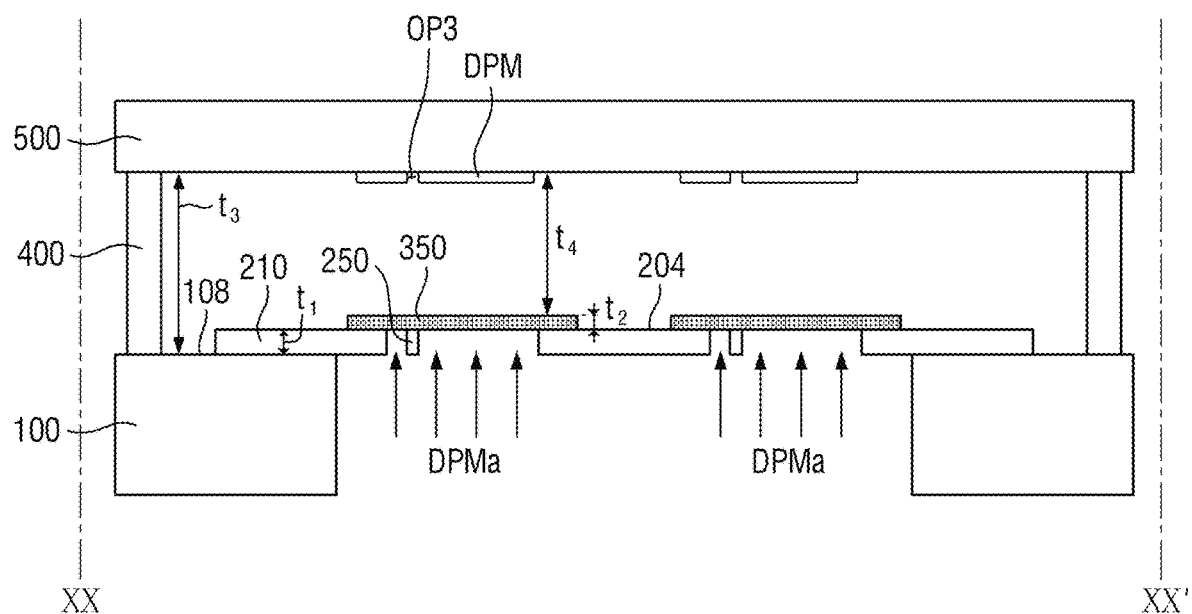
FIG. 20 is a cross-sectional view taken along line XX-XX' of FIG. 19.
Figure 21:
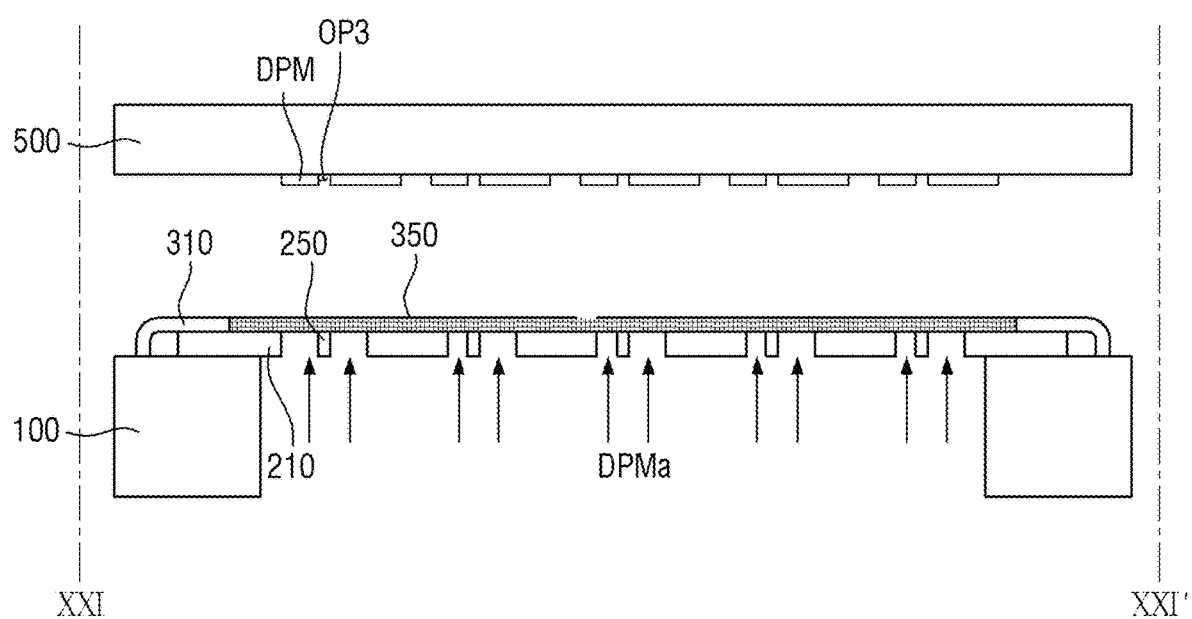
FIG. 21 is a cross-sectional view taken along line XXI-XXI' of FIG. 19.
Figure 22:
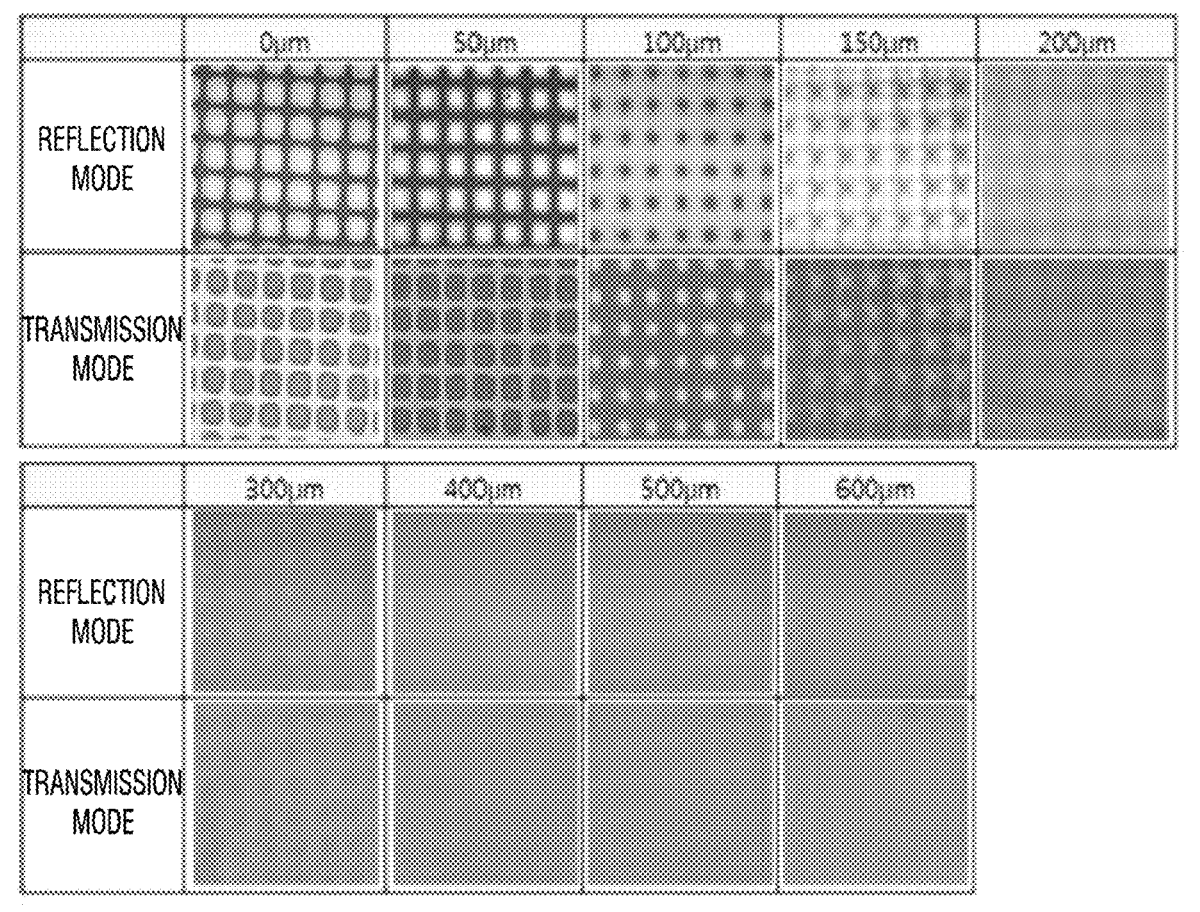

FIG. 19 is a plan view illustrating an exemplary step in a method of manufacturing a display device according to principles of the invention. FIG. 20 is a cross-sectional view taken along line XX-XX' of FIG. 19. FIG. 21 is a cross-sectional view taken along line XXI-XXI' of FIG. 19. FIG. 22 is a pictorial table depicting films deposited according to a gap between a metal sheet and a target substrate.

Referring to FIGS. 19 to 22, a deposition mask 1 according to one exemplary embodiment is provided.

As described above, the deposition mask 1 may include a frame 100 including a first opening OP1, an open sheet 200 including a first portion 210 which is disposed above the first opening OP1 of the frame 100 and surrounds at least one second opening OP2 and second portions 250 which are disposed in second openings OP2 when viewed from a Z-axis-direction, e.g., above, and are physically separated from the first portion 210, and metal sheets 300 which include metal connecting portions 310 which are disposed on the open sheet 200 and connected to the frame 100 and metal mesh portions 350 which are disposed to overlap the second portions 250.

Then, a target substrate 500 is disposed on the deposition mask 1. The target substrate 500 may be a deposition substrate on which a deposition material DPMa is deposited through the deposition mask 1. The target substrate 500 may be a rigid substrate including a rigid material such as at least one of a glass and a quartz, but is not limited thereto, and may be a flexible substrate including a flexible material. The target substrate 500 may have a generally rectangular shape when viewed from above. However, the target substrate 500 is not limited thereto, but may be a square shape, a circular shape, an oval shape, or any polygonal shape.

In the operation in which the target substrate 500 is disposed on the deposition mask 1, the target substrate 500 may be disposed to be in direct contact with SUS members 400. As described above, the open sheet 200 may have a first thickness t1, the metal sheet 300 may have a second thickness t2, the SUS member 400 may have a third thickness t3, and the difference between the third thickness t3 and the total sum of the first thickness t1 and the second thickness t2 may be a fourth thickness t4.

The first thickness t1 may range, for example, from about 100 μm to about 200 μm, the second thickness t2 may range, for example, from about 20 μm to about 40 μm.

The third thickness t3 may be greater than the total sum of the first thickness t1 and the second thickness t2. Accordingly, a predetermined gap between the target substrate which will be disposed above the SUS members 400 and the metal sheet 300 may be maintained. The third thickness t3 may be set by considering the fourth thickness t4. The third thickness t3 may be set in a range such that the fourth thickness t4 is at least about 600 μm.

The deposition material DPMa is conducted (e.g., by spraying) to the deposition mask 1 upwardly from under the deposition mask 1. The deposition material DPMa is deposited on the target substrate 500 through the first opening OP1 (see FIG. 1) and the second openings OP2 (see FIG. 1).

More specifically, when the deposition material DPMa is conducted to the deposition mask 1 upwardly from under the deposition mask 1, the deposition material DPMa may be conducted upwardly to the deposition mask 1 at a region excluding the first opening OP1 due to the frame 100. That is, only the deposition material DPMa which moves toward the first opening OP1 is conducted to the open sheet 200.

The deposition material DPMa conducted to the open sheet 200 is conducted to the metal sheet 300 at a region excluding the second openings OP2 due to the first portion 210 and the second portions 250 of the open sheet 200. That is, only the deposition material DPMa which moves toward the second openings OP2 of the deposition material DPMa which passes through the first opening OP1 is conducted to the metal sheet 300.

The deposition material DPMa conducted to the metal sheet 300 is not conducted to the target substrate 500 due to first lines L1 and second lines L2 of the metal sheet 300 at a region excluding a metal opening formed of the above-described first lines L1 and second lines L2 of the metal sheet 300. That is, only the deposition material DPMa which moves toward the metal opening of the deposition material DPMa which passes through the open sheet 200 is conducted to the target substrate 500.

Only the deposition material DPMa which moves toward the first opening OP1, the second openings OP2, and the metal opening is conducted to the target substrate 500 to form a deposition film DPM. The deposition film DPM may further include third openings OP3 formed therein. A region excluding the third openings OP3 in the deposition film DPM may roughly correspond to the first opening OP1, the second openings OP2, and the metal opening.

The third openings OP3 of the deposition film DPM may be disposed to roughly overlap the second portions 250 of the open sheet 200 and correspond thereto. In addition, the deposition film DPM may further include patterns or fourth openings corresponding to the first lines L1 and second lines L2.

The gap t4 is disposed between the metal mesh portion 350 of the metal sheet 300 and the target substrate 500. Even when the gap t4 is large, and only the deposition material DPMa moving toward the metal opening in the deposition material DPMa passing through the open sheet 200 is conducted to the target substrate 500, visibility of the patterns or the fourth openings of the deposition film DPM corresponding to the first lines L1 and the second lines L2 of the metal mesh portion 350 may be substantially reduced. This will be described with reference to FIG. 22.

Referring to FIG. 22, planar shapes of the deposition films DPM are illustrated in each of a reflection mode and a transmission mode according to the gap t4 between the metal mesh portion 350 and the target substrate 500. The generally planar shape in the reflection mode is formed by emitting light upward from under the deposition film DPM and capturing an image of the deposition film DPM, and the generally planar shape in the transmission mode is formed by emitting light downward from above the deposition film DPM and capturing an image of the deposition film DPM. In the reflection mode, relatively dark portions are the patterns or the fourth openings of the deposition film DPM, and relatively bright portions are bright portions in which the patterns or the fourth openings are not disposed in the deposition film DPM. In the transmission mode, relatively bright portions are the patterns or the fourth openings of the deposition film DPM, and relatively dark portions are portions in which the patterns or the fourth openings are not disposed in the deposition film DPM.

As illustrated in FIG. 22, as the gap t4 between the metal mesh portion 350 and the target substrate 500 increases from about 0 μm to about 50 μm, and up to about 600 μm, the relatively dark portions are not significantly visible in the reflection mode, and the relatively bright portions are not significantly visible in the transmission mode.

The gap between the metal mesh portion 350 and the target substrate 500 according to one exemplary embodiment may range from about 500 μm to 2000 μm. The gap between the metal mesh portion 350 and the target substrate 500 may range from about 600 μm to about 1000 μm. When the gap between the metal mesh portion 350 and the target substrate 500 is at least about 600 μm, the patterns or the fourth openings of the deposition film DPM may be not recognizable by visual inspection, and when the gap between the metal mesh portion 350 and the target substrate 500 is no more than about 1000 μm, the deposition process is not being easily performed in light of a spatial limit due to an enlarged deposition apparatus which accommodates the deposition mask 1 and the target substrate 500.

As described above, in the method of manufacturing the display device according to one embodiment, since the second portion 250 of the deposition mask 1 is physically separated from the first portion 210 and serves to form a hole of a deposition film, a plurality of deposition masks or a connecting member, for example, a thin bar, which connects the second portion 250 and the first portion 210 is not necessary to form the hole of the corresponding deposition film during a deposition process for the deposition film of the display device. When the plurality of deposition masks is used to form the hole of the corresponding deposition film, the process time period and process cost is increased. When the connecting member, for example, a thin bar, which connects the second portion 250 and the first portion 210 is used to form the hole of the corresponding deposition film, since a dark line and the like may be visible from the deposition film due to the connecting member, a visual defect may occur.

However, in the method of manufacturing the display device using the deposition mask 1, since the deposition mask 1 includes the above-described second portion 250, the hole of the corresponding deposition film may be formed using only one open mask, and thus process efficiency can be improved, and the dark line on the deposition film due to the connecting member which connects the second portion 250 and the first portion 210 is prevented from being visible, and thus a visual defect can be fundamentally prevented.

Hereinafter, another embodiment of the above-described deposition mask 1 will be described. Detailed descriptions of the components which are the same as or similar to those of the above-described embodiment will be omitted to avoid redundancy.

Figure 23:
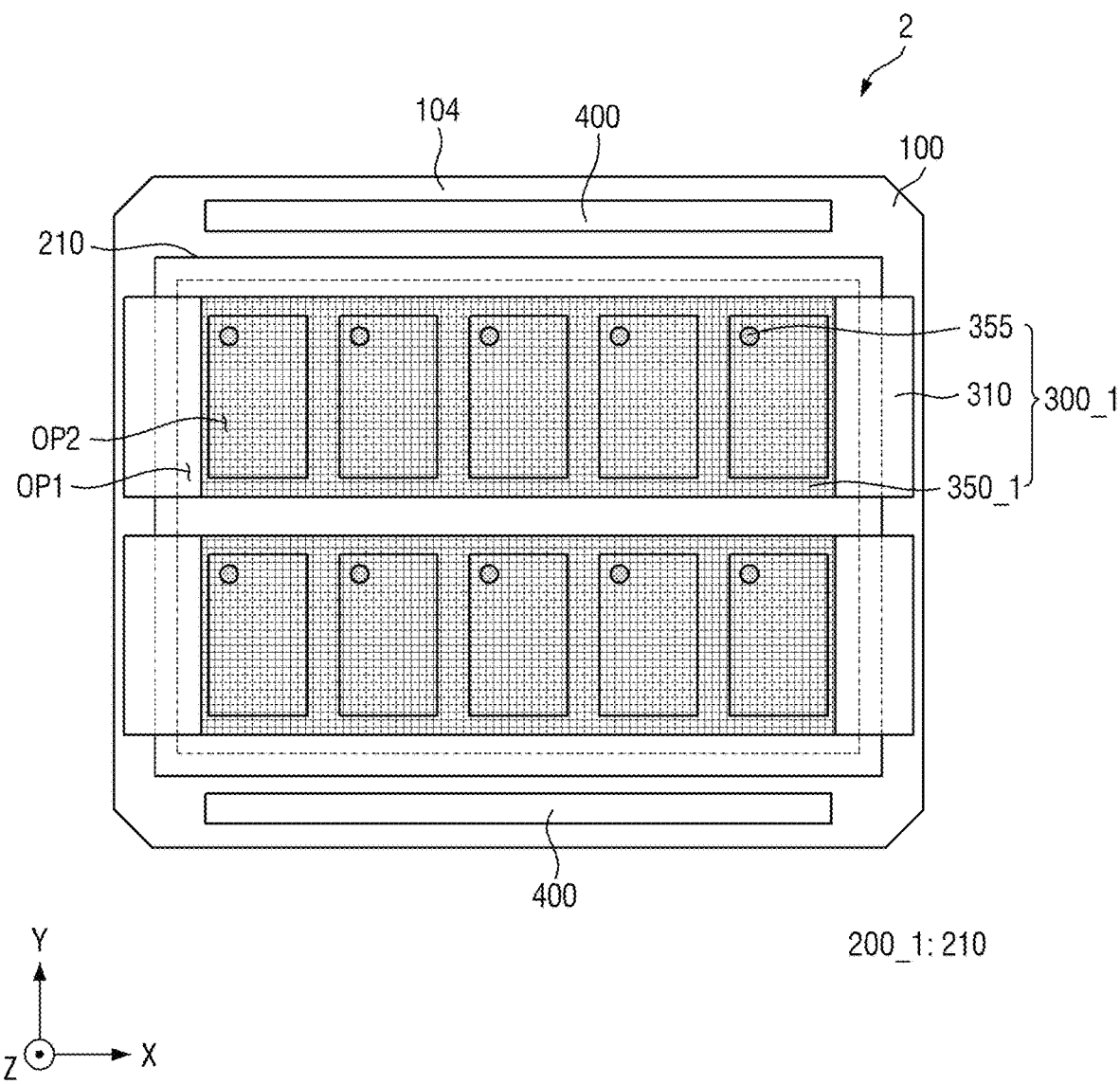
FIG. 23 is a plan view illustrating another exemplary embodiment of a deposition mask constructed according to principles of the invention.

FIG. 23 is a plan view illustrating another exemplary embodiment of a deposition mask constructed according to principles of the invention.

Referring to FIG. 23, deposition mask 2 differs from the deposition mask 1 of FIGS. 1, 3, and 4 in that an open sheet 200_1 includes only a first portion 210 and does not include second portions.

More specifically, in the deposition mask 2, the open sheet 200_1 may include only the first portion 210 and may not include the second portions. In the deposition mask 2, metal sheets 300_1 may further include one or more plugs, which may be in the form of one or more deposition blocking parts 355. The deposition blocking parts 355 may be surrounded by metal mesh portions 350_1 of the metal sheets 300_1 when viewed from above.

The deposition blocking parts 355 may serve substantially the same function as that of the second portions 250 of the open sheet 200 described above with reference to FIGS. 1, 3, and 4. The deposition blocking parts 355 are not coplanar with the second portions 250 in a stacking structure but may be disposed at the same position thereof when viewed from above. The deposition blocking parts 355 may be connected to the metal mesh portions 350_1, coplanar therewith, and formed of the same material thereof. The generally planar shape of the deposition blocking part 355 may be the same as that of the second portion 250 described above with reference to the FIGS. 1, 3, and 4, but is not limited thereto.

Figure 24:
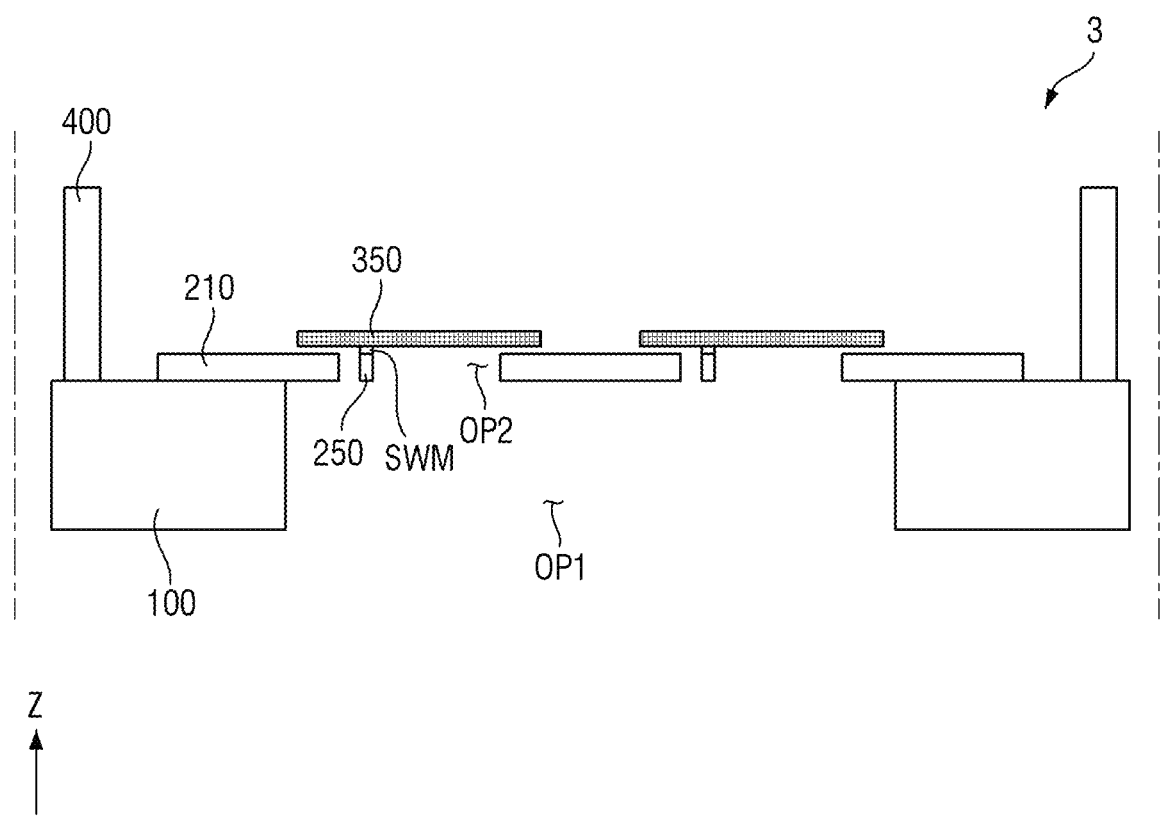
FIG. 24 is a cross-sectional view illustrating another exemplary embodiment of a deposition mask constructed according to principles of the invention.

FIG. 24 is a cross-sectional view illustrating another exemplary embodiment of a deposition mask constructed according to principles of the invention.

Referring to FIG. 24, a deposition mask 3 differs from the deposition mask 1 according to one illustrated exemplary embodiment in that the deposition mask 3 further includes connecting patterns SWM between metal mesh portions 350 and second portions 250 of an open sheet 200.

More specifically, the deposition mask 3 may further include the connecting patterns SWM between the metal mesh portions 350 and the second portions 250 of the open sheet 200. The connecting patterns SWM may be disposed between the metal mesh portions 350 and the second portions 250 and connected to the metal mesh portions 350 and the second portions 250. The connecting patterns SWM may be disposed between the metal mesh portions 350 and the second portions 250 and directly connected to the metal mesh portions 350 and the second portions 250. The connecting patterns SWM may be disposed between the metal mesh portions 350 and the second portions 250 and directly connected to the metal mesh portions 350 and the second portions 250 through a method such as a welding method.

The generally planar shape of the connecting pattern SWM may be substantially the same as that of the second portion 250 but is not limited thereto.

The planar size of the connecting pattern SWM may be the same as that of the second portion 250. For example, the planar size of the connecting pattern SWM may be less than that of the second portion 250. Since the planar size of the connecting pattern SWM is less than that of the second portion 250, movement of a deposition material DPMa may be prevented from being hindered due to the connecting patterns SWM, and thus a deposition film DPM having a desired size and shape can be formed.

Since a welding method for the connecting patterns SWM, and the metal mesh portions 350, and the second portions 250 has been described, a detailed description thereof will be omitted to avoid redundancy.

Deposition masks constructed according to the principles exemplary implementations of the invention and exemplary methods of manufacturing same and display devices using such a deposition mask have improved manufacturing process efficiency and/or avoid visual defects in the resulting deposition film.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing a deposition mask for making a display device comprising the steps of:
    providing an open sheet having a first portion surrounding at least one opening, a second portion disposed in the at least one opening, and a third portion connecting the first portion and the second portion;
    disposing a metal sheet having a metal mesh portion on the open sheet; and
    welding the metal mesh portion and the second portion and removing the third portion from the open sheet.

2. The method of claim 1, wherein the steps of welding of the metal mesh portion and the second portion and removing the third portion from the open sheet are performed using a laser.

3. A method of manufacturing a display device comprising the steps of:
    providing a deposition mask including a frame having a first opening, an open sheet disposed above the first opening of the frame and having a first portion surrounding at least one second opening and a second portion disposed in the second opening and physically separated from the first portion, and a metal sheet disposed on the open sheet and having a metal connecting portion connected to the frame and a metal mesh portion overlapping the second portion and having deposition openings therein;
    disposing a target substrate in a position spaced apart from the metal mesh portion by a gap;
    depositing a deposition material on the target substrate through the deposition openings in the metal mesh portion; and
    forming a deposition film including a third opening formed by a part that overlaps the second portion.

* * * * *